(12) United States Patent
Huang et al.

(10) Patent No.: US 9,451,694 B2
(45) Date of Patent: Sep. 20, 2016

(54) PACKAGE SUBSTRATE STRUCTURE

(71) Applicant: IBIS Innotech Inc., Taichung (TW)

(72) Inventors: Chih-Kung Huang, Taichung (TW);
Wei-Jen Lai, Taichung (TW);
Wen-Chun Liu, Taichung (TW)

(73) Assignee: IBIS Innotech Inc., Taichung (TW)

( * ) Notice: Subject to any disclaimer, the term of this patent is extended or adjusted under 35 U.S.C. 154(b) by 41 days.

(21) Appl. No.: 14/663,447

(22) Filed: Mar. 19, 2015

(65) Prior Publication Data

US 2015/0373849 A1 Dec. 24, 2015

(30) Foreign Application Priority Data

Jun. 24, 2014 (TW) .............................. 103121829 A

(51) Int. Cl.
| | |
|---|---|
| H05K 7/10 | (2006.01) |
| H05K 7/12 | (2006.01) |
| H05K 1/03 | (2006.01) |
| H05K 3/18 | (2006.01) |
| H05K 3/40 | (2006.01) |
| H05K 3/46 | (2006.01) |
| H05K 1/11 | (2006.01) |
| H05K 3/00 | (2006.01) |
| H05K 3/10 | (2006.01) |

(52) U.S. Cl.
CPC ............ *H05K 1/0373* (2013.01); *H05K 3/188* (2013.01); *H05K 3/4007* (2013.01); *H05K 1/113* (2013.01); *H05K 3/0014* (2013.01); *H05K 3/105* (2013.01); *H05K 3/4697* (2013.01); *H05K 2201/0236* (2013.01); *H05K 2201/0376* (2013.01); *H05K 2201/0919* (2013.01); *H05K 2201/09063* (2013.01); *H05K 2201/09118* (2013.01); *H05K 2201/10151* (2013.01); *H05K 2201/10515* (2013.01); *H05K 2201/10674* (2013.01)

(58) Field of Classification Search
USPC .................................. 361/767; 174/258, 262
See application file for complete search history.

(56) References Cited

U.S. PATENT DOCUMENTS

| 2010/0127372 | A1* | 5/2010 | Holland | ................... | H01L 24/14 |
| | | | | | 257/685 |
| 2012/0139090 | A1* | 6/2012 | Kim | ....................... | H01L 25/16 |
| | | | | | 257/659 |

OTHER PUBLICATIONS

Korczynski, "Wafer-level packaging of ICs for mobile systems of the future," Semiconductor Manufacturing & Designs Community, May 2014, pp. 1-5.

* cited by examiner

*Primary Examiner* — Andargie M Aychillhum
(74) *Attorney, Agent, or Firm* — Jianq Chyun IP Office

(57) ABSTRACT

A package structure includes a selective-electroplating epoxy compound, a first patterned circuit layer, second patterned circuit layers, metal studs, contact pads and conductive vias. The selective-electroplating epoxy compound includes cavities, a first surface and a second surface. The cavities disposed on the first surface in array arrangement. The selective-electroplating epoxy compound is formed by combining non-conductive metal complex. The metal studs are disposed in the cavities respectively and protruded from the first surface. The first patterned circuit layer is directly disposed on the first surface. The selective-electroplating epoxy compound exposes a top surface of the patterned circuit layer. The top surface is lower than or coplanar with the first surface. The second patterned circuit layers are directly disposed on the second surface. The conductive vias are disposed at the selective-electroplating epoxy compound to electrically connect the second patterned circuit layers to the corresponding metal studs.

35 Claims, 29 Drawing Sheets

PACKAGE SUBSTRATE STRUCTURE

CROSS-REFERENCE TO RELATED APPLICATION

This application claims the priority benefit of Taiwan application serial no. 103121829, filed on Jun. 24, 2014. The entirety of the above-mentioned patent application is hereby incorporated by reference herein and made a part of this specification.

BACKGROUND

1. Field of the Invention

The invention is directed to a package substrate structure and more particularly, to a package substrate structure capable of forming patterned circuit layers by directly electroplating a selective-electroplating epoxy compound thereof.

2. Description of Related Art

In the information society nowadays, people tend to rely on electronic products more and more. To meet with the requirements of high speed, high performance, and being light, thin, and compact on the electronic products nowadays, flexible circuit boards having flexibility are more commonly applied in various electronic products, such as mobile phones, notebook PCs, digital cameras, tablet PCs, printers, and disk players, etc.

Generally speaking, in production of a package structure, a preprocessing process, a sputtering process, a copper-laminating or copper-plating process and a pholithography process are performed on one or two opposite surfaces of an insulation substrate to form circuit layers thereon. However, the processes in the manufacturing method are complicated and the cost of sputtering is relatively high. Moreover, it is challenging for a patterned circuit layer formed by using a patterned dry film as an electroplating barrier to meet the requirement of fine pitch nowadays. Moreover, the insulation layer is typically made of a polyimide or an Ajinomoto build-up film (ABF) resin, which costs higher. Therefore, the package structures are currently manufactured in complicated processes with high cost.

Besides, in order to increase circuit density of a package insulation substrate, a silicon chip is commonly employed as the insulation substrate in the industry. However, a manufacturing process for a silicon insulation substrate is complicated and has to go through complicated processes such as polishing process in a chip fab, long-term deep etching of conductive vias, washing, oxidation, sputtering, plating, photoresist covering, exposure, development, etching, washing, oxidation, photoresist covering, exposure, development, etching and washing, etc. A thickness of the silicon insulation substrate is generally at least 200μ. Such thickness has difficulty in reduction due to structural brittleness and limitations of the manufacturing process, which leads to incapability of effectively reducing overall thickness of a package structure using the package substrate and to higher cost due to the complicated processes. Moreover, in the two types of package insulation substrates, connection circuits are formed by a stacking process and thus, formed on surfaces of insulation dielectric layers.

Accordingly, how to form patterned circuit layers on a insulation material by selectively electroplating the same and how to apply the technique to the package structures have become one of the issues to be resolved for the industry.

SUMMARY

The invention provides a package substrate structure capable of forming patterned circuit layers by directly electroplating a selective-electroplating epoxy compound thereon, which contributes to simplified manufacturing process, smaller overall thickness and more flexible circuit design.

The invention is directed to a package substrate structure, including a first selective-electroplating epoxy compound, a first patterned circuit layer, a plurality of metal studs, a plurality of second patterned circuit layers and a plurality of conductive vias. The selective-electroplating epoxy compound includes a plurality of cavities, and a first and a second surfaces which are opposite to each other. The cavities are disposed on the first surface, and the first selective-electroplating epoxy compound includes non-conductive metal complex. The metal studs are respectively disposed in the cavities and protrude from the first surface. The first patterned circuit layer is directly disposed on the first surface. The first selective-electroplating epoxy compound exposes a top surface of the first patterned circuit layer, and the top surface of the first patterned circuit layer is lower than or coplanar with first surface. The second patterned circuit layers are directly disposed on the second surface. The conductive vias are disposed in the selective-electroplating epoxy compound to electrically connect second patterned circuit layers to the corresponding metal studs.

The invention is directed to a package substrate structure, including a selective-electroplating epoxy compound, a first patterned circuit layer, a second patterned circuit layer and a plurality of conductive vias. The selective-electroplating epoxy compound includes a first surface, a second surface opposite to the first surface and non-conductive metal complex. The first patterned circuit layer is directly disposed on the first surface, and a top surface of the first patterned circuit layer is lower than or coplanar with the first surface. The second patterned circuit layer is directly disposed on the second surface, and a top surface of the second patterned circuit layer is lower than or coplanar with the second surface. The conductive vias is disposed in the selective-electroplating epoxy compound to electrically connect the first patterned circuit layer with the second patterned circuit layer which are corresponding to each other.

In light of the foregoing, the invention utilizes the selectively electroplating characteristics of the selective-electroplating epoxy compound to form the conductive structures such as the patterned circuit layers, the conductive vias or the pads by directly electroplating the surface of the selective-electroplating epoxy compound. The selective-electroplating epoxy compound includes the non-conductive metal complex, such that after the selective-electroplating epoxy compound is selectively irradiated by laser light or UV light, the conductive structures such as the patterned circuit layers, the conductive vias or the pads can be formed by selectively electroplating the surface of the selective-electroplating epoxy compound directly. Therefore, the selective-electroplating epoxy compound can be adapted for various types of package substrate structures to form circuit layers on the selective-electroplating epoxy compound by utilizing the selective-electroplating characteristic thereof.

Moreover, the patterned circuit layers formed in this way can not only meet the standard of fine pitch but also offer flexibility in designing the connection circuits on the package substrate structure. Meanwhile, the selective-electroplating epoxy compound is shaped by means of molding and thus, has better flexibility in designing the thickness and the shape thereof, which contributes to the production of extremely thin selective-electroplating epoxy compound. Accordingly, the package substrate structure of the invention can not only meet the standard of fine pitch, but also be manufactured by simplified manufacturing process and have smaller overall thickness.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
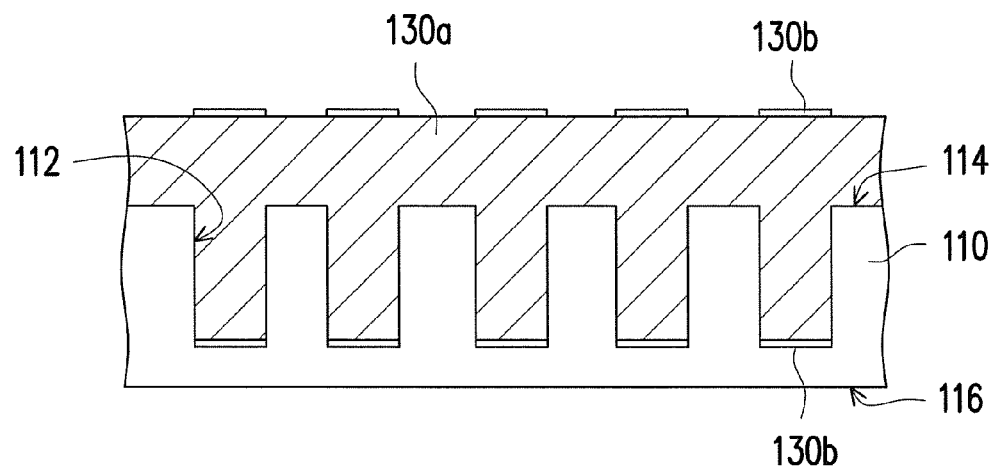
FIG. 1A through FIG. 1B are schematic cross-sectional views of a manufacturing process of a package substrate structure according to an embodiment of the invention.

It is to be understood that the foregoing and other detailed descriptions, features, and effects are intended to be described more comprehensively by providing embodiments accompanied with figures hereinafter. In the following embodiments, wording used to indicate directions, such as "up," "down," "front," "back," "left," and "right," merely refers to directions in the accompanying drawings. Therefore, the directional wording is used to illustrate rather than limit the invention. Moreover, the same or similar reference numerals represent the same or similar elements in the following embodiments.

Figure 1B:
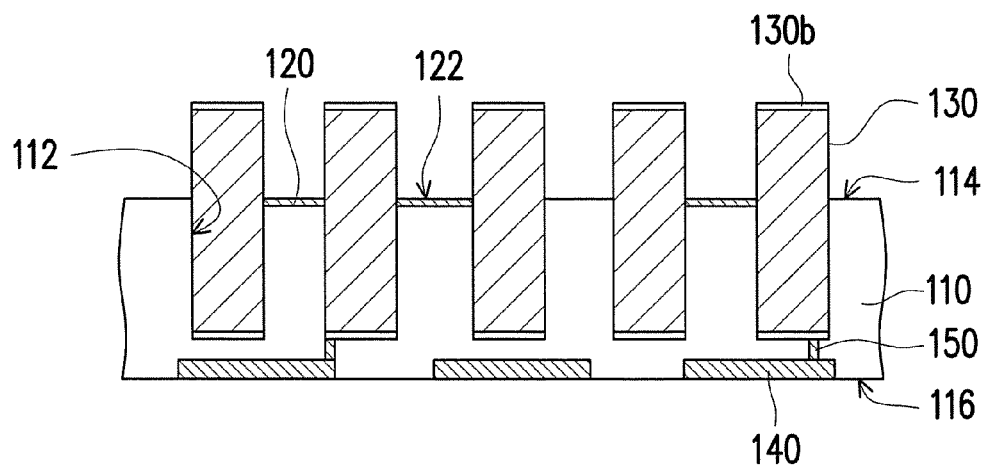

FIG. 1A through FIG. 1B are schematic cross-sectional views illustrating a manufacturing process of a package substrate structure according to an embodiment of the invention. A manufacturing method of a package substrate structure of the present embodiment includes the following steps. First, referring to FIG. 1A, a metal substrate is provided, and patterned photo-resist layers 130b are formed on two opposite surfaces of the metal substrate. Then, a half etching process is performed on one of the surfaces of the metal substrate by employing one of the patterned photo-resist layers 130b as an etching barrier to form a patterned metal substrate 130a as illustrated in FIG. 1A which has a plurality of metal protrusions connected with each other. In the present embodiment, the patterned photo-resist layers 130b may be made of gold, silver or any other suitable material. Thereafter, a first selective-electroplating epoxy compound 110 is formed on the patterned metal substrate 130a. The first selective-electroplating epoxy compound 110 includes a first surface 114 and a second surface 116 opposite to each other. The first selective-electroplating epoxy compound 110 covers the metal protrusions to form a plurality of cavities 112 on the first selective-electroplating epoxy compound 110. The cavities 112 are arranged in an array and located on the first surface 114 in the way as the metal protrusions are.

Figure 2:
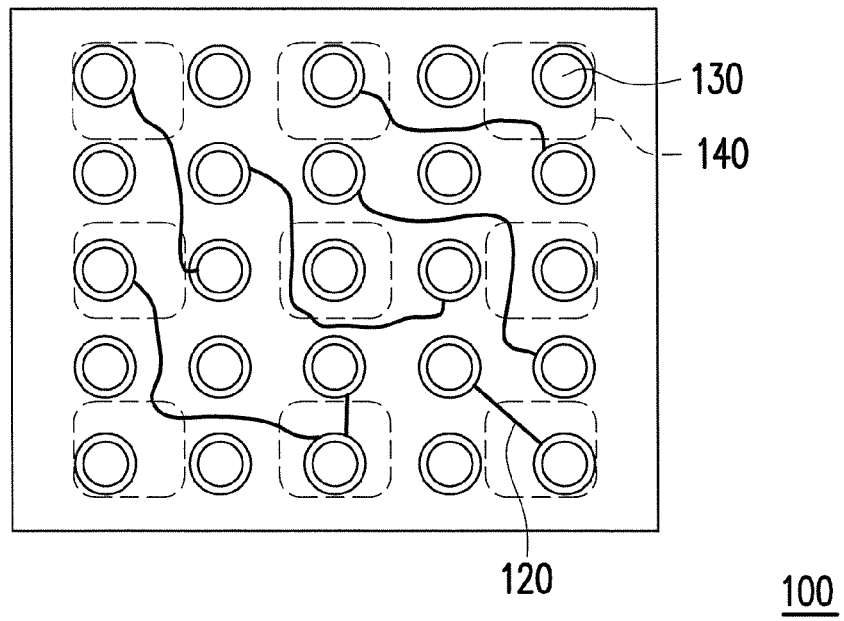
FIG. 2 is a schematic top view of the package substrate structure illustrated in FIG. 1B.
Figure 3:
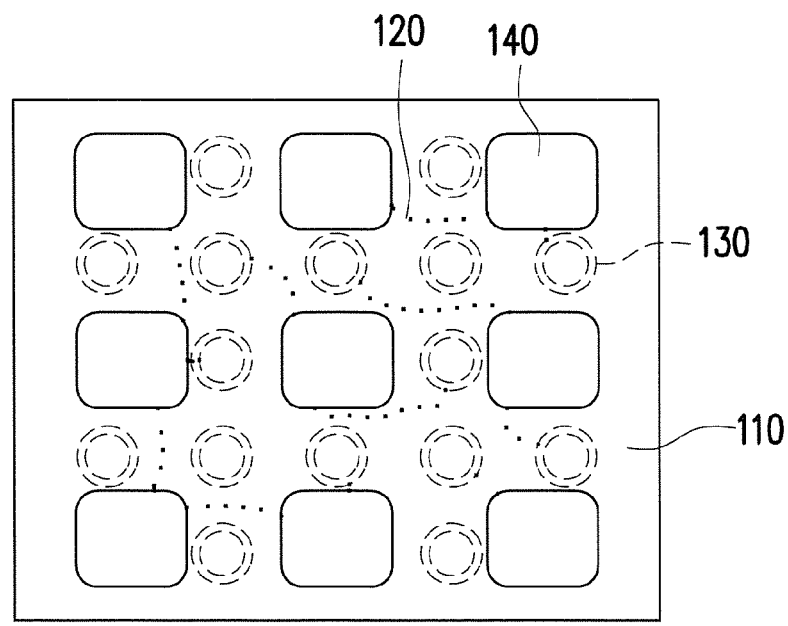
FIG. 3 is a schematic bottom view of the package substrate structure illustrated in FIG. 1B.

FIG. 2 is a schematic top view of the package substrate structure illustrated in FIG. 1B. FIG. 3 is a schematic bottom view of the package substrate structure illustrated in FIG. 1B. Following the above, with reference to FIG. 1B through FIG. 3, the half etching process is then performed again on the other surface of the patterned metal substrate 130a by employing the other patterned photo-resist layer 130b as the etching barrier to form a plurality of metal studs 130 separated from each other and arranged in an array, as shown in FIG. 1B and FIG. 2. Referring to FIG. 1B, the metal studs 130 are respectively disposed in the cavities 112 and protrude from the first surface 114.

Then, referring to FIG. 1B and FIG. 2, a first patterned circuit layer 120 is formed directly on the first surface 114 by utilizing the selectively electroplating characteristic of the first selective-electroplating epoxy compound 110, such that the first patterned circuit layer 120 is directly disposed on the first surface 114 and electrically connected with the corresponding metal studs 130. Specifically, in the present embodiment, the first selective-electroplating epoxy compound 110 is selectively electroplated, such that the fine first patterned circuit layer 120 is formed thereon. In the present embodiment, the first selective-electroplating epoxy compound 110 includes non-conductive metal complex, and the non-conductive metal complex may include palladium (Pd), chromium, or copper complex.

In detail, the step of forming the first patterned circuit layer by selectively electroplating the surface of the first selective-electroplating epoxy compound 110 may include the following steps. A circuit trench corresponding to the patterned circuit layer 120 is carved on the first surface 114 of the first selective-electroplating epoxy compound 110 along a path where the patterned circuit layer 120 is to be formed by laser, such that the non-conductive metal complex located at the circuit trench is damaged to release heavy metal nuclei which is highly active in metal reduction. Then, the first selective-electroplating epoxy compound 110 is selective electroplated, so as to form the patterned circuit layer 120 on the circuit trench by direct electroplating. Thus, the first patterned circuit layer 120 formed by the process is embedded in the first selective-electroplating epoxy compound 110, and the first selective-electroplating epoxy compound 110 exposes a top surface 122 of the first patterned circuit layer 120. Moreover, the circuit trench corresponding to the first patterned circuit layer 120 is carved directly on the surface of the first selective-electroplating epoxy compound 110 by using laser, so then the first patterned circuit layer 120 is formed on the circuit trench by direct electroplating. Therefore, the top surface 122 of the first patterned circuit layer 120 may be lower than or coplanar with the first surface 114, as shown in FIG. 1B. Additionally, both the top surfaces of the first patterned circuit layer and the second patterned circuit layer which are formed directly on the first selective-electroplating epoxy compound may be lower than or coplanar with the surface of the first selective-electroplating epoxy compound. Certainly, the present embodiment is merely an example for illustration, but not intended to limit the invention.

Afterwards, in the present embodiment, a second patterned circuit layer 140 is formed directly on the second surface 116 of the first selective-electroplating epoxy compound 110 in the same way, such that the second patterned circuit layer 140 is directly disposed on the second surface 116. Thus, a surface of the second patterned circuit layer 140 exposed by the first selective-electroplating epoxy compound 110 may be lower than or coplanar with the second surface 116, as shown in FIG. 1B. Then, a plurality of first conductive vias 150 are formed in the first selective-electroplating epoxy compound to electrically connect the second patterned circuit layer 140 to the corresponding metal studs 130. Thereby, the package substrate structure 100 of the present embodiment is formed. In the present embodiment, the moldable first selective-electroplating epoxy compound 110 is employed as the substrate of the package structure, and thus, a thickness and a shape of the first selective-electroplating epoxy compound 110 is adjustable according to product requirement. In the present embodiment, a maximum thickness of the first selective-electroplating epoxy compound 110 may be limited to range from 50 to 100 microns (μm), and thus, a maximum thickness of the package substrate structure 100 may also be reduced accordingly.

Figure 4:
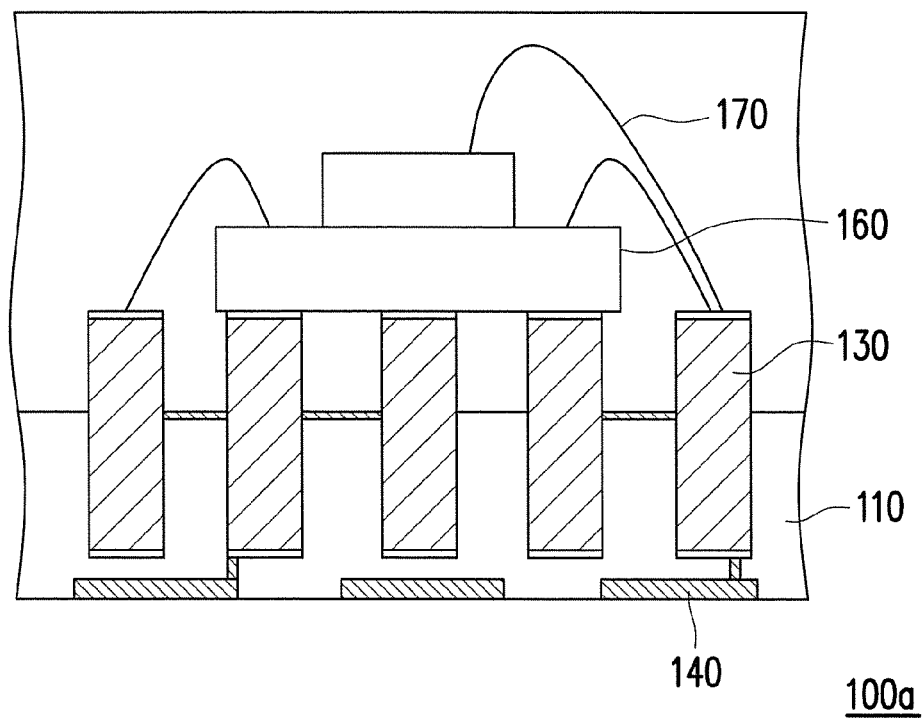
FIG. 4 through FIG. 7 are schematic cross-sectional views of package substrate structures according to various embodiments of the invention.
Figure 5:
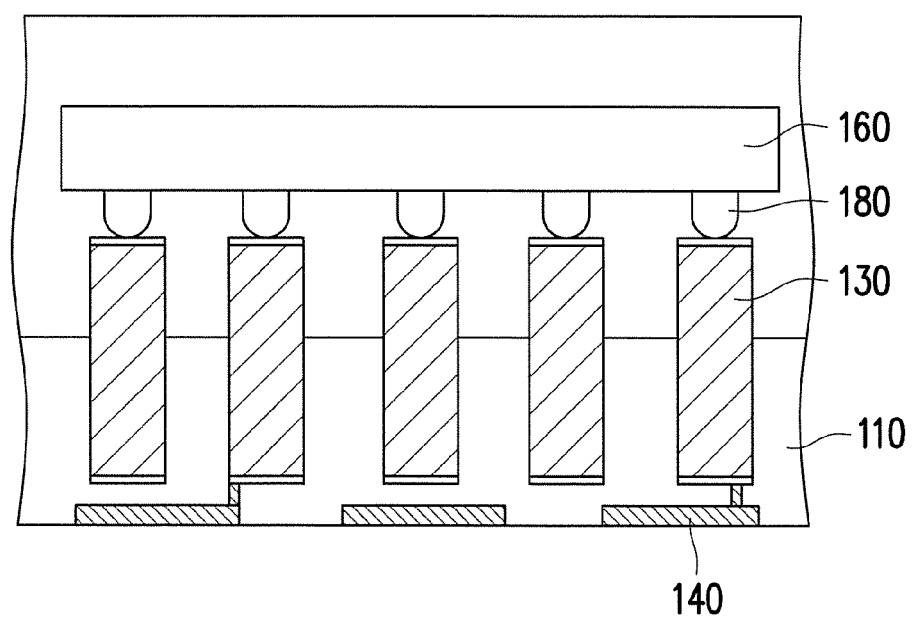
Figure 6:
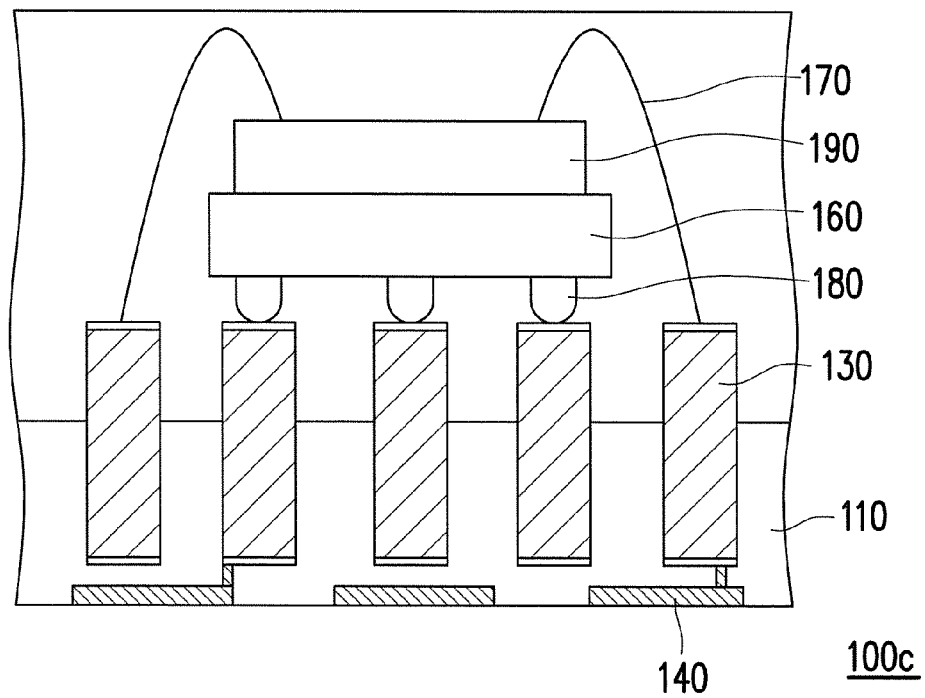

FIG. 4 through FIG. 7 are schematic cross-sectional views of package substrate structures according to various embodiments of the invention. A first chip 160 may be further disposed on the metal studs 130 and electrically connected with the metal studs 130. In an embodiment of the invention, the package substrate structure 100a may further include a plurality of wires 170, and the first chip 160 may be electrically connected to the metal studs 130 through the wires 170, as shown in FIG. 4. In another embodiment of the invention, a package substrate structure 100b may include a plurality of solder balls 180, and the first chip 160 may be electrically connected to the metal studs 130 through the solder balls 180, as shown in FIG. 5.

In another embodiment of the invention, a package substrate structure 100c may include a plurality of wires 170, a plurality of solder balls 180 and a second chip 190. The second chip 190 is stacked on the first chip 160. The solder balls 180 are disposed between the first chip 160 and a part of the metal studs 130, and the wires 170 are connected between the second chip 190 and another part of the metal studs 130. In other words, the first chip 160 is electrically connected to a part of the metal studs 130 though the solder balls 180, and the second chip 190 is electrically connected to another portion of the metal studs 130 through the wires 170.

Figure 7:
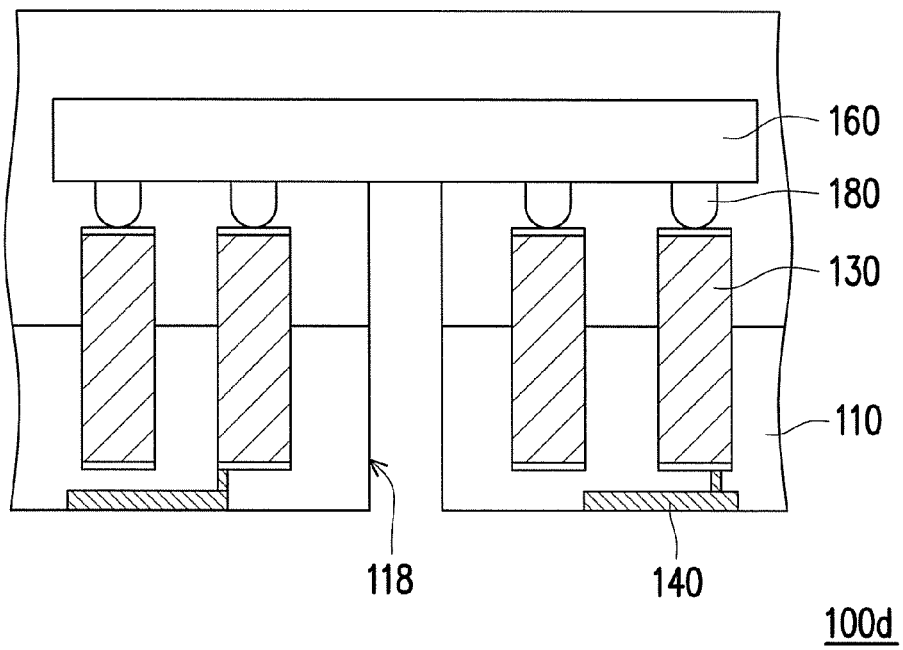

Additionally, in an embodiment of the invention, the first selective-electroplating epoxy compound 110 of the package substrate structure 100d may further include a through hole 118 located between the metal studs 130 and penetrates through the first selective-electroplating epoxy compound 110. The first chip 160 is disposed on the metal studs 130, and the through hole 118 exposes an active surface of the first chip 160, as shown in FIG. 7. Thereby, when the first chip 160 serves to communicates with the external environment, the through hole 118 may be employed for sensing the external environment. For example, the first chip 160 may be a temperature, humidity, pressure or audio frequency sensing element, a complementary metal oxide semiconductor (CMOS) image sensing element, or a radio frequency (RF) element, and the through hole 118 may be employed as a through hole for sensing the external environment, a vent for ventilation or a sound hole for resonance. Thus, the package substrate structure 100d of the invention may meet specific requirement for the special application of the first chip 160.

Figure 8:
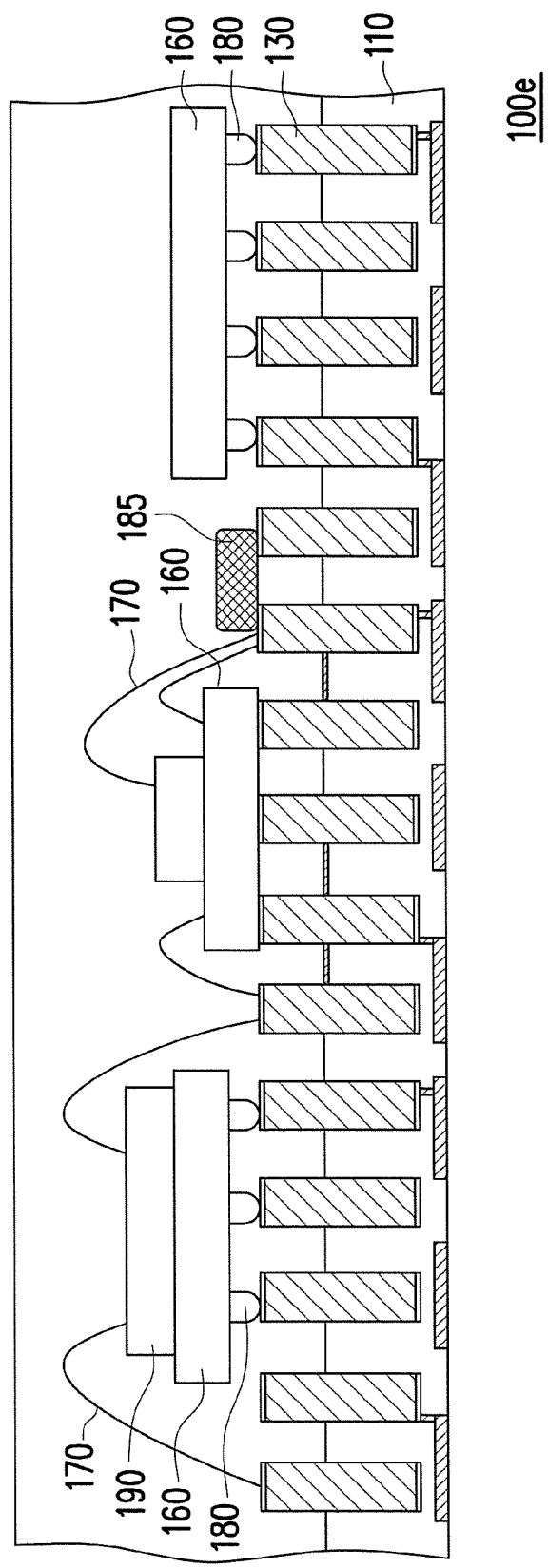
FIG. 8 through FIG. 9 are schematic views of package substrate structures according to various embodiments of the invention.
Figure 9:
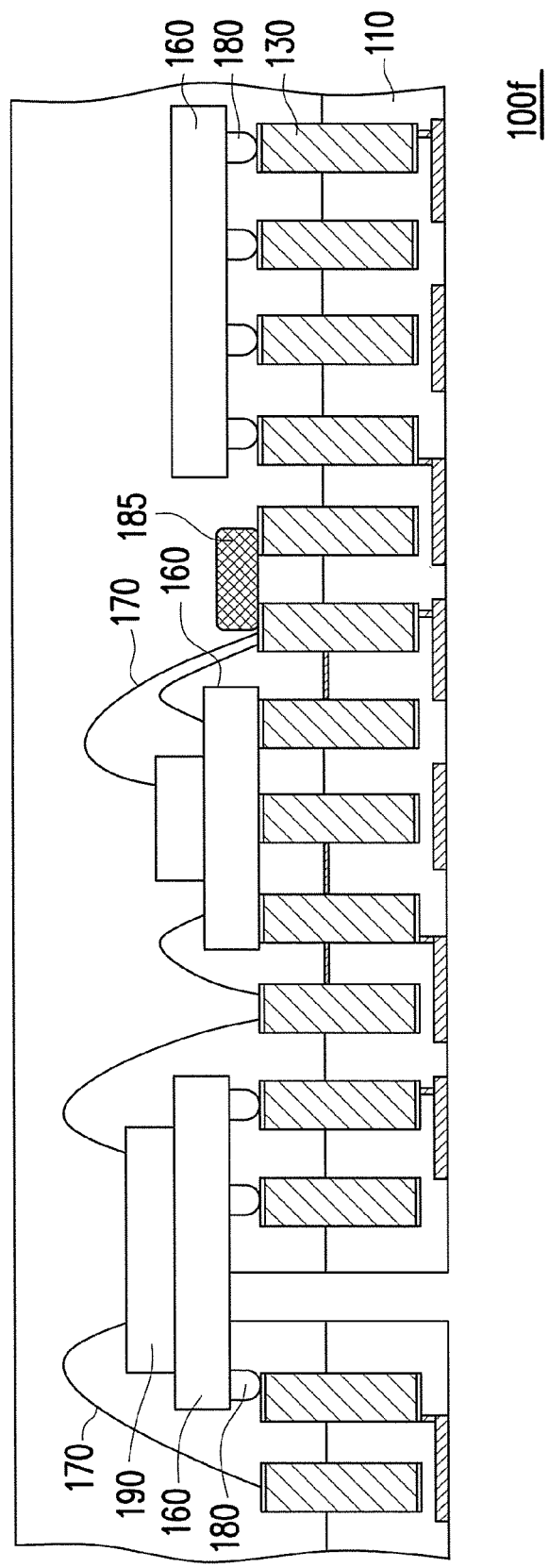
Figure 10:
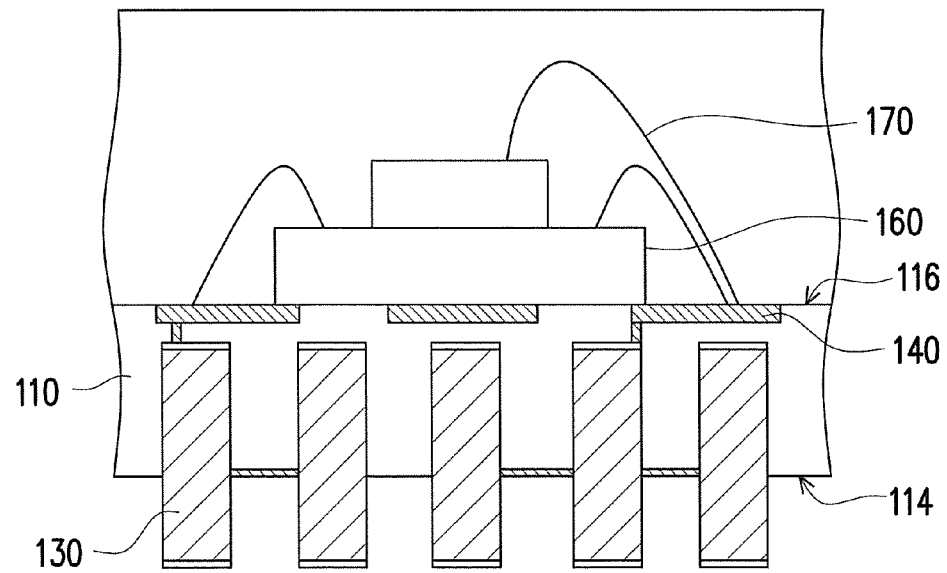
FIG. 10 through FIG. 15 are schematic views of package substrate structure according to various embodiments of the invention.
Figure 11:
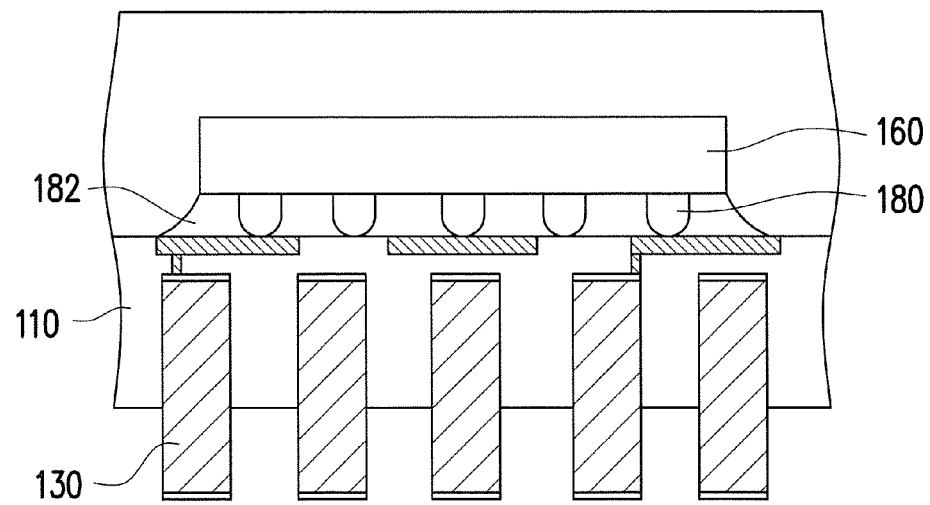
Figure 12:
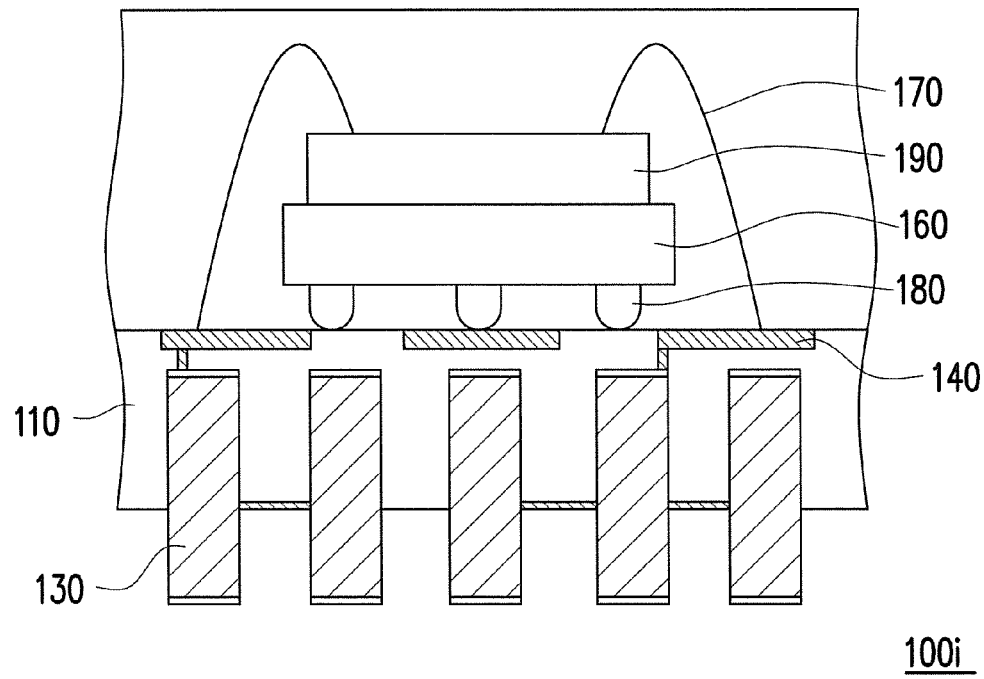
Figure 13:
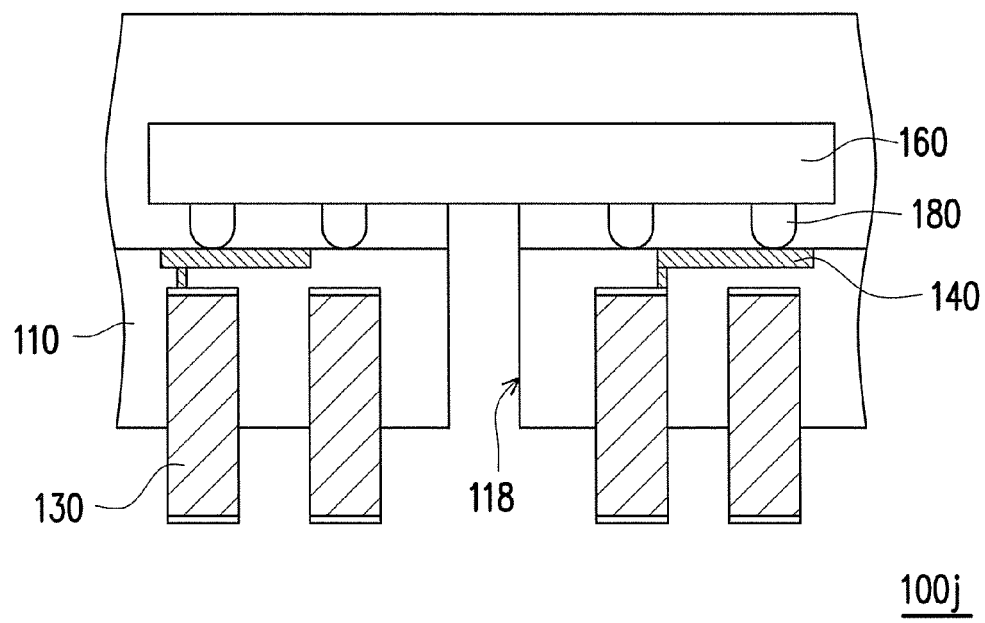
Figure 14:
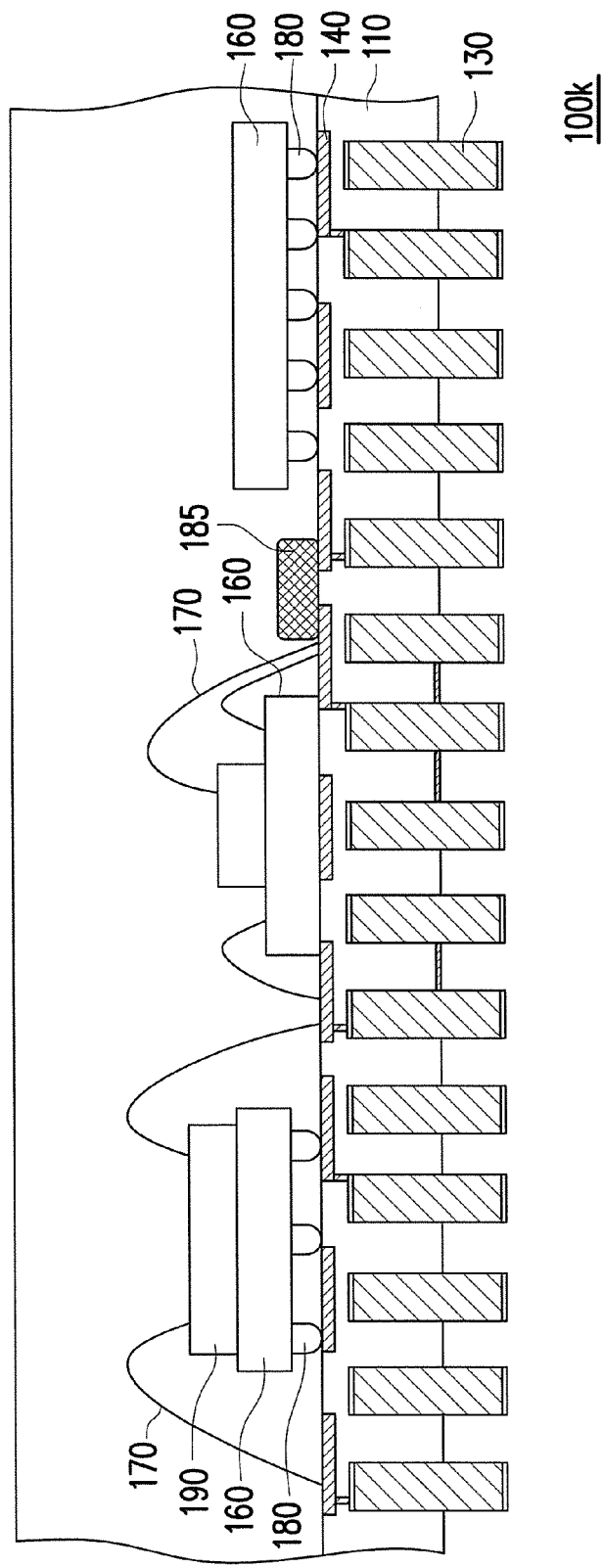
Figure 15:
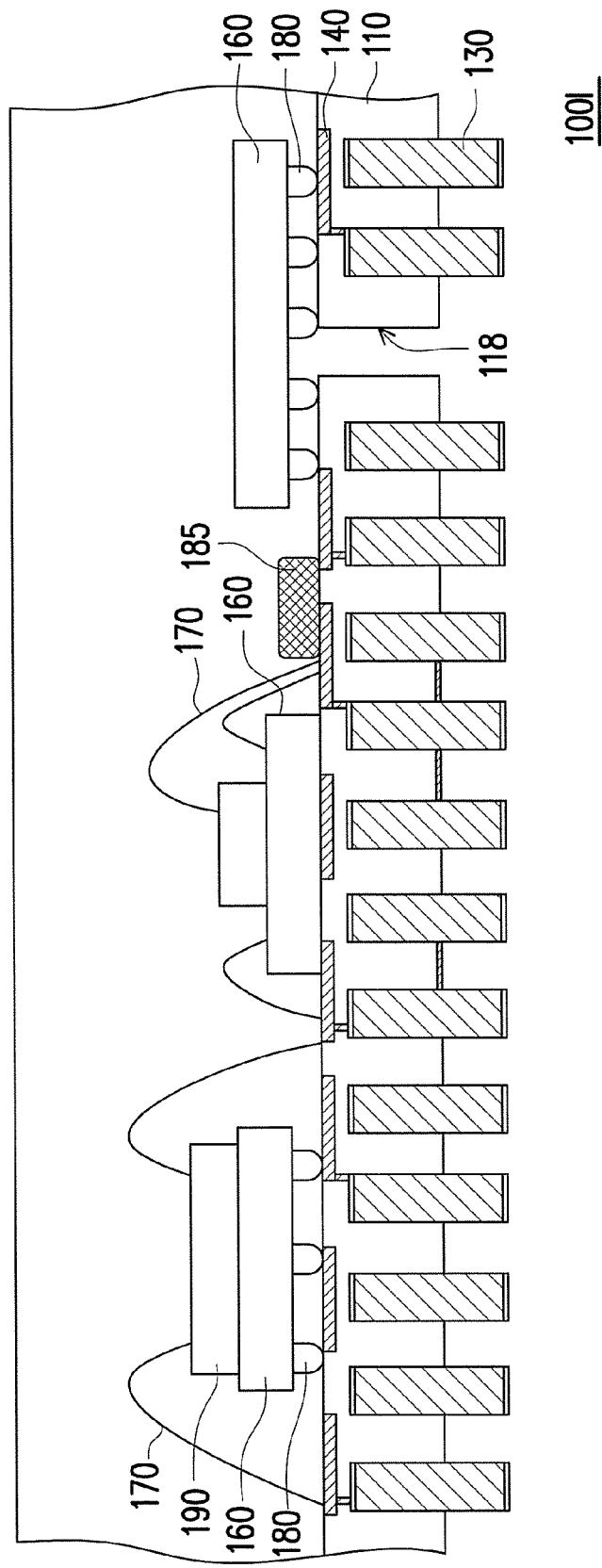

FIG. 8 through FIG. 9 are schematic views of package substrate structures according to various embodiments of the invention. Certainly, in an embodiment of the invention, the structures illustrated in FIG. 4 through FIG. 7 may be arranged and combined with one another to form package substrate structures 100e and 100f illustrated in FIG. 8 and FIG. 9. For example, the package substrate structure 100e may be formed by combining the structures illustrated in FIG. 4 through FIG. 6 and includes a plurality of first chips 160, a plurality of wires 170, a plurality of solder balls 180 and at least one second chip 190, as shown in FIG. 8. The first chips 160 are directly disposed above the metal studs 130 and electrically connected to a portion of the metal studs 130 through the solder balls 180 or the wires 170, and the second chip 190 may be stacked on the corresponding first chips 160 and electrically connected to the other portion of the metal studs 130 through the wires 170 to form a system in package (SIP). Additionally, in the present embodiment, the package substrate structure 100e may further include an RF chip 185 which is disposed on and electrically connected with a part of the metal studs 130 to form the SIP or a wireless RF module, as shown in FIG. 8.

In another embodiment, the package substrate structure 100f may be formed by combining the structures illustrated in FIG. 4, FIG. 5 and FIG. 7. In other words, the package substrate structure 100f may include a plurality of first chips 160, a plurality of wires 170, a plurality of solder balls 180 and at least one second chip 190, as shown in FIG. 9. The first chips 160 are directly disposed above the metal studs 130 and electrically connected to a portion of the metal studs 130 through the solder balls 180 or the wires 170, and the second chip 190 may be stacked on the corresponding first chips 160 and electrically connected to the other portion of the metal studs 130 through the wires 170. Meanwhile, the selective-electroplating epoxy compound 110 of the package substrate structure 100f may further include a through hole 118 located between the metal studs 130 and penetrates through the selective-electroplating epoxy compound 110. The through hole 118 exposes an active surface of one of the first chips 160, as shown in FIG. 9. Thereby, when the first chip 160 serves to communicate with the external environment, the through hole 118 may be employed as a through hole for sensing the external environment. For example, the first chips 160 temperature, humidity, pressure or audio frequency sensing elements, CMOS image sensing elements, or RF element, and the through hole 118 may be employed as a through hole for sensing the external environment, a vent for ventilation or a sound hole for resonance. Thus, the package substrate structure 100f of the invention may meet specific requirement for the special application of the first chip 160. Moreover, in the present embodiment, the package substrate structure 100f may further include an RF chip 185 which is disposed on and electrically connected with a part of the metal studs 130 to form the SIP or a wireless RF module, as shown in FIG. 9.

FIG. 10 through FIG. 15 are schematic views of package substrate structure according to various embodiments of the invention. It should be mentioned that package substrate structures illustrated in FIG. 10 through FIG. 15 are respectively similar to the package substrate structure illustrated in FIG. 4 through FIG. 9, and thus, the element labels and partial content of the previous embodiments are referenced hereinafter, and the same or similar elements are indicated by the same or similar reference labels. The descriptions of the same technical details are therefore not repeated here. The parts omitted from description may be referenced from the afore-described embodiments and are not repeated in the embodiment below.

As mentioned above, package substrate structures illustrated in FIG. 10 through FIG. 15 are respectively similar to the package substrate structures illustrated in FIG. 4 through FIG. 9, though in package substrate structures 100g, 100h, 100i, 100j, 100k and 100l, the first chip 160 is disposed on the second patterned circuit layers 140 of the corresponding second chip, and the first chip 160 is electrically connected with the metal studs 130 through the second patterned circuit layer 140 and the first conductive vias 150. Additionally, it should be mentioned that the package substrate structure 100h illustrated in FIG. 11 may further include an underfill 182 filled between the first chip 160 and the second patterned circuit layer 140. In the embodiments illustrated in FIG. 13 and FIG. 15, the through hole 118 is disposed between the second patterned circuit layers 140. Due to fabrication process limitation, each of the metal studs 130 has to be separated from each other with a certain distance, which leads to difficulty in meeting the requirement of fine pitch. Thus, in these embodiments, the first chip 160 is disposed on the second patterned circuit layers 140 on the second surface 116 to reconfigure the circuit layout by means of the second patterned circuit layer 140 and the first conductive vias 150, such that a pitch between the second patterned circuit layers 140 may be shortened to meet the requirement of fine pitch.

Figure 16A:
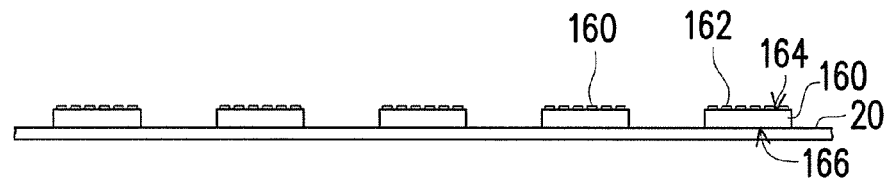
FIG. 16A through FIG. 16B are schematic cross-sectional views of part of a manufacturing process of a package substrate structure according to an embodiment of the invention.
Figure 16B:
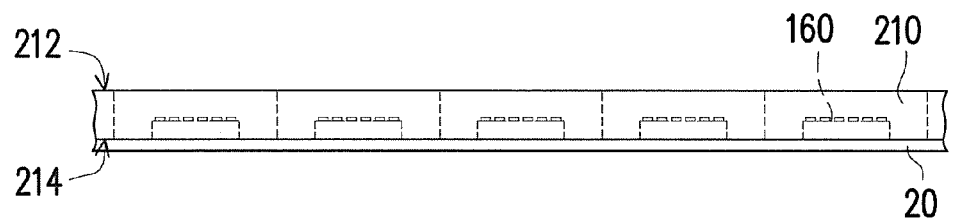

FIG. 16A through FIG. 16B are schematic cross-sectional views of part of a manufacturing process of a package substrate structure according to an embodiment of the invention. First, referring to FIG. 16A, a plurality of first chips 160 are disposed on a release film 20. Each first chip 160 includes a plurality of first pads 162, an active surface 164 and a back surface 166 opposite to the active surface 164, and the first pads 162 are disposed on the active surface 164 and adhered to the release film 20 with the back surface 166 of the first chip 160. Then, a second selective-electroplating epoxy compound 210 is formed on the release film 20 to cover the first chip 160s and the active surfaces 164 and the first pads 162 thereof. The second selective-electroplating epoxy compound 210 includes a third surface 212 and a fourth surface 214 opposite to each other. Thereafter, the release film 20 is removed to expose the back surface 166 of each first chip 160. Afterwards, the first chips 160 may be electrically connected with the metal studs illustrated in FIG. 1B, and the structure is then singularized. Namely, a cutting process is performed on the structure to obtain a plurality of package structures including the first chips 160 separated from each other.

The first chips 160 may be disposed on the package substrate structure 100 illustrated in FIG. 1B in various ways, and several embodiments of disposing methods and package substrate structures formed thereby are provided below; however, it is appreciated by persons having ordinary skilled in the art that the following embodiments are illustrated as examples, but the invention is not limited thereto.

Figure 17:
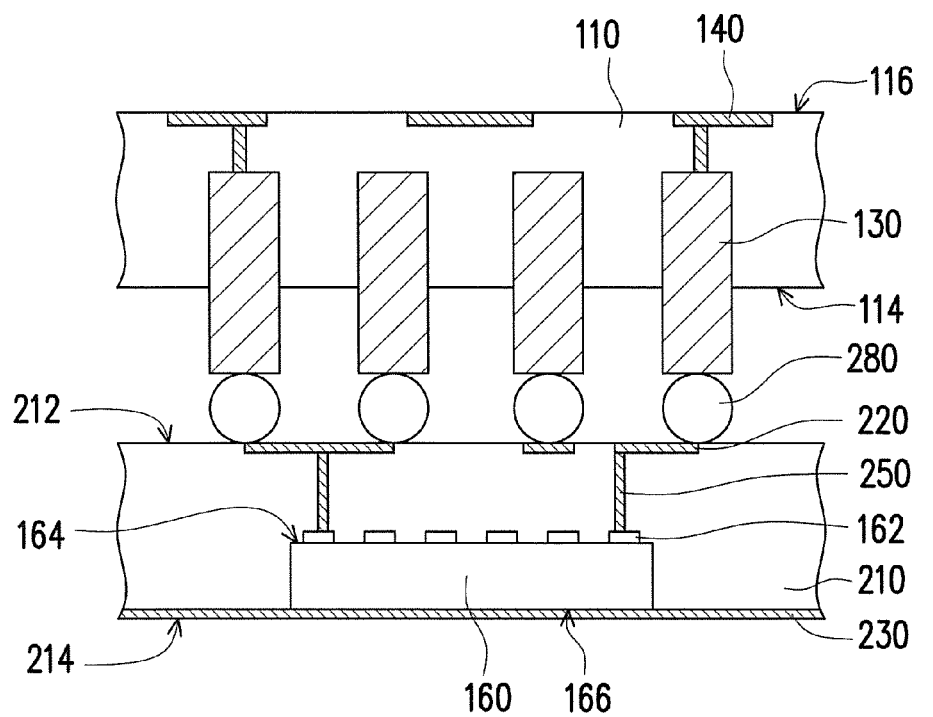
FIG. 17 through FIG. 20 are schematic cross-sectional views of package substrate structures according to various embodiments of the invention.

FIG. 17 through FIG. 20 are schematic cross-sectional views of package substrate structures according to various embodiments of the invention. First, referring to FIG. 17, in the present embodiment, a package substrate structure 200 further includes a plurality of second conductive vias 250, a plurality of solder balls 280 and a third patterned circuit layer 220. The second conductive vias 250 is directly disposed in the second selective-electroplating epoxy compound 210 to connect the first pads 162 to the third surface 212 of the second selective-electroplating epoxy compound 210. Solder balls 280 are disposed on the third surface 212, and electrically connected with the second conductive vias 250 respectively. The first chip 160 is connected to the metal studs 130 through the solder balls 280, as shown in FIG. 17. The second selective-electroplating epoxy compound 210 of the present embodiment is composed of compositions substantially the same as the selective-electroplating epoxy compound 110 of the previous embodiments. Therefore, in the present embodiment, a third patterned circuit layer 220 may be formed on the third surface 212 of the second selective-electroplating epoxy compound 210 directly by utilizing the selective electroplating method of the previous embodiments. The third patterned circuit layer 220 electrically connects the second conductive vias 250 to the corresponding solder balls 280. In the present embodiment, the second conductive vias 250 and the third patterned circuit layer 220 may also be formed by directly carving circuit trenches of the third patterned circuit layer 220 and the second conductive vias 250 on the second selective-electroplating epoxy compound 210 using laser and then, directly electroplating the second selective-electroplating epoxy compound 210 on the circuit tranches in the same way as the above embodiments. Thus, a top surface of the third patterned circuit layer 220 may be lower than or coplanar with the third surface 212, as shown in FIG. 17.

In this way, the first chip 160 may be electrically connected to the metal studs 130 through the second conductive vias 250, the third patterned circuit layer 220 and the solder balls 280, and the package substrate structure 200 of the present embodiment may be further connected to a motherboard through the second patterned circuit layer 140 on the selective-electroplating epoxy compound 110.

Figure 18:
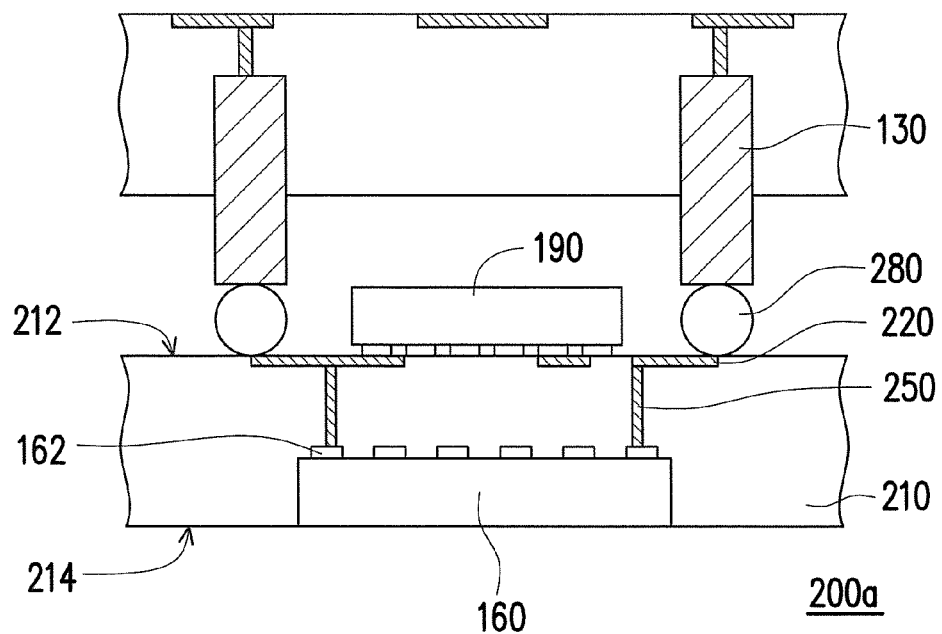

Then, referring to FIG. 18, it should be mentioned that a package substrate structure 200a of the present embodiment is similar to the package substrate structure 200 of FIG. 17, and thus, the element labels and partial content of the previous embodiments are referenced hereinafter, and the same or similar elements are indicated by the same or similar reference labels. The descriptions of the same technical details are therefore not repeated here. The parts omitted from description may be referenced from the afore-described embodiments and are not repeated in the embodiment below. Difference between the package substrate structure 200a of the present embodiment and the package substrate structure 200 of FIG. 17 will be described below.

The package substrate structure 200a of the present embodiment may further include a second chip 190 disposed above the third surface 212 of the second selective-electroplating epoxy compound 210 and electrically connected with the third patterned circuit layer 220. Specifically, the second chip 190 is disposed on the third surface 212 of the second selective-electroplating epoxy compound 210 by means of flip chip bonding and electrically connected with the third patterned circuit layer 220 located on the third surface 212. The second chip 190 may be located between the solder balls 280. Thereby, both the first chip 160 and the second chip 190 may be electrically connected to the metal studs 130 through the third patterned circuit layer 220 and the solder balls 280.

Thereafter, referring to FIG. 19, it should be mentioned that a package substrate structure 200b of the present embodiment is similar to the package substrate structure 200a of FIG. 18, and thus, the element labels and partial content of the previous embodiments are referenced hereinafter, and the same or similar elements are indicated by the same or similar reference labels. The descriptions of the same technical details are therefore not repeated here. The parts omitted from description may be referenced from the afore-described embodiments and are not repeated in the embodiment below. Difference between the package substrate structure 200b of the present embodiment and the package substrate structure 200a of FIG. 18 will be described below.

The second chip 190 of the present embodiment is disposed on the fourth surface 214 of the second selective-electroplating epoxy compound 210. In detail, the package substrate structure 200b of the present embodiment may further include a plurality of wires 270, a plurality of third conductive vias 260 and a molding compound 290. The third conductive vias 260 penetrates through the second selective-electroplating epoxy compound 210, as shown in FIG. 19, to connect the fourth surface 214 of the second selective-electroplating epoxy compound 210, the third patterned circuit layer 220 located on the third surface 212 and the corresponding solder balls 280. The second chip 190 is stacked on the first chip 160 in a back-to-back manner, located on the fourth surface 214 and electrically connected to the third conductive vias 260 through the wires 270. Thereafter, the second chip 190 and the wires 270 are covered by the molding compound 290. In the present embodiment, the encapsulation adhesive 290 may be composed of the same composition as the selective-electroplating epoxy compounds 110 and 210, or may be a general molding compound.

Figure 20:
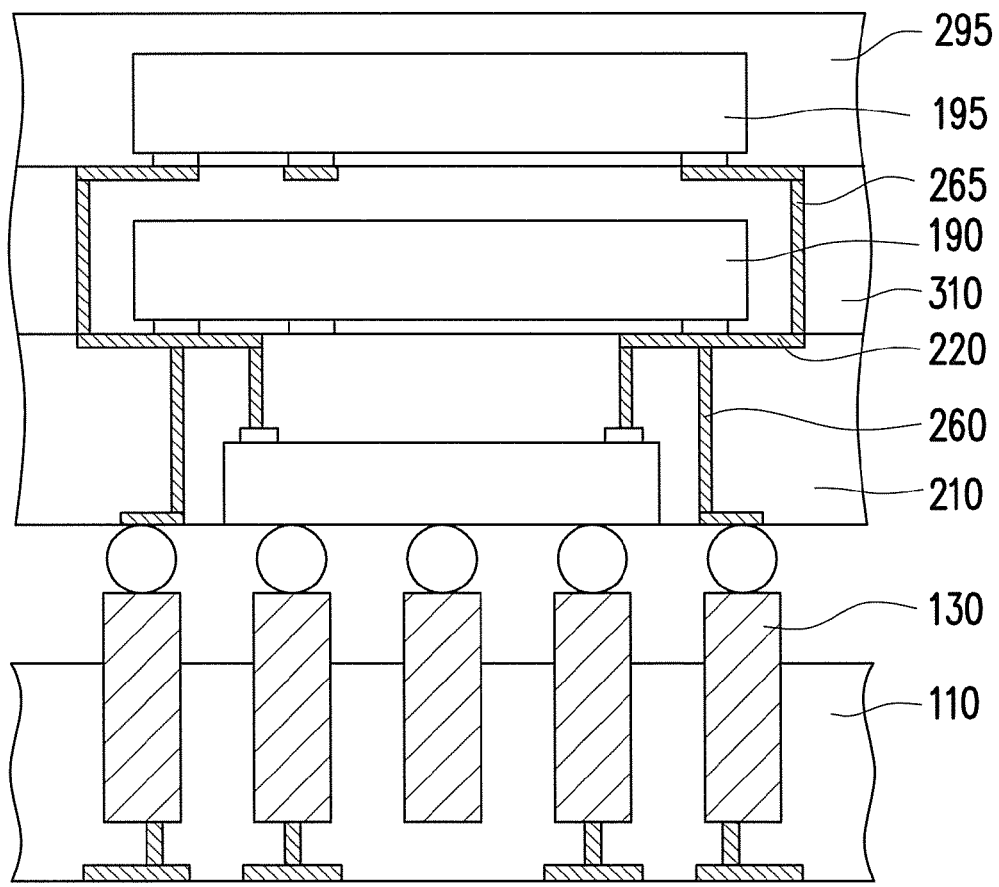

Certainly, in a package substrate structure 200c of the present embodiment, a third chip 195 may be further stacked on a top surface of the molding compound 290, as shown in FIG. 20. The third chip 195 may be disposed in a manner similar to that of the second chip, electrically connected to the third patterned circuit layer 220 through the conductive vias 265 penetrating through the third selective-electroplating epoxy compound 31 and covered by the molding compound 295. The present embodiment is not intended to limit the number of the stacking layers of the package substrate structure and the electrical connecting manner thereof.

Figure 21:
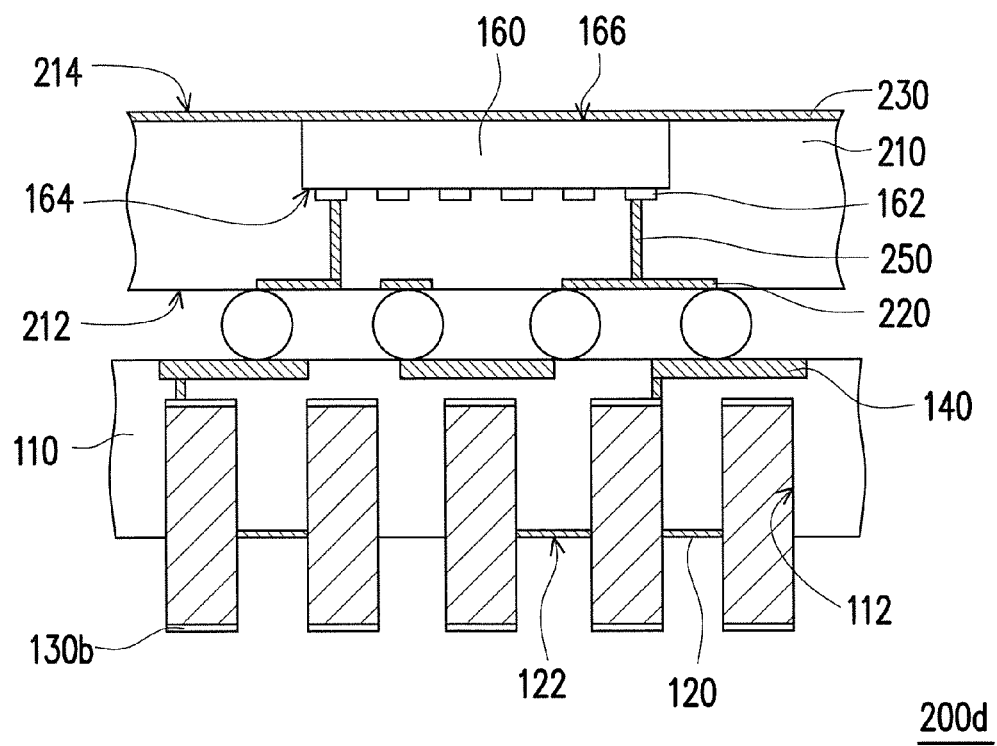
FIG. 21 through FIG. 23 are schematic cross-sectional views of package substrate structures according to various embodiments of the invention.
Figure 22:
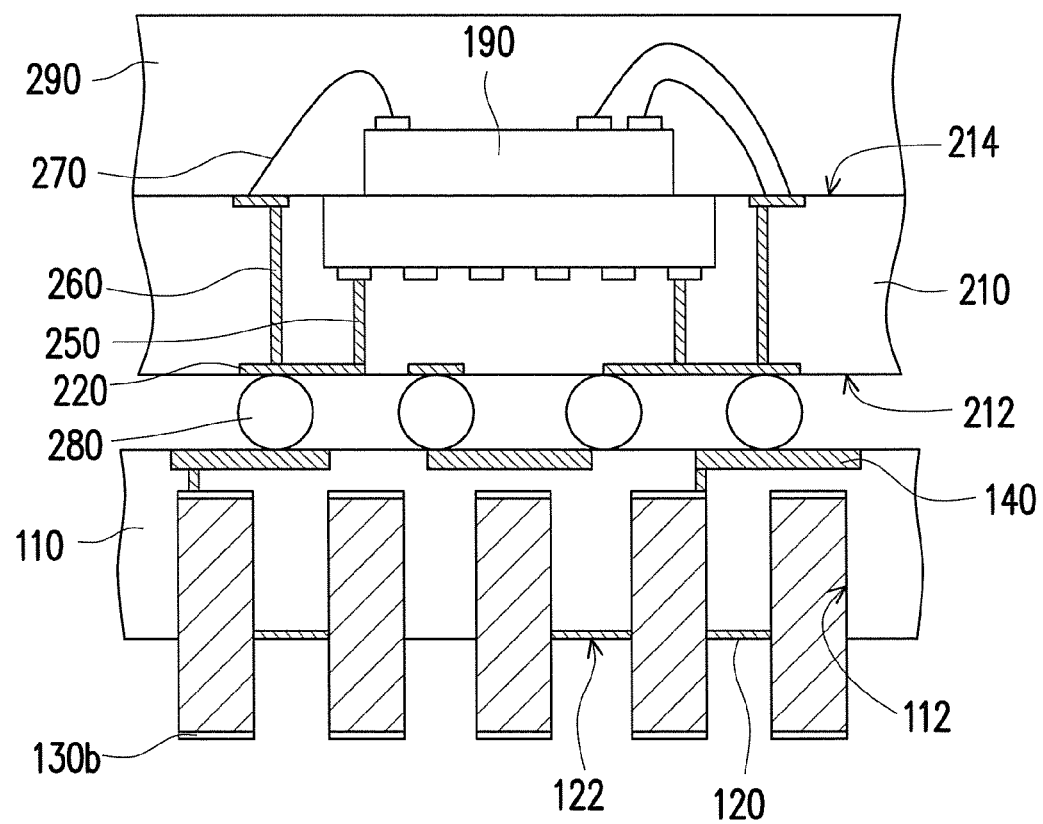
Figure 23:
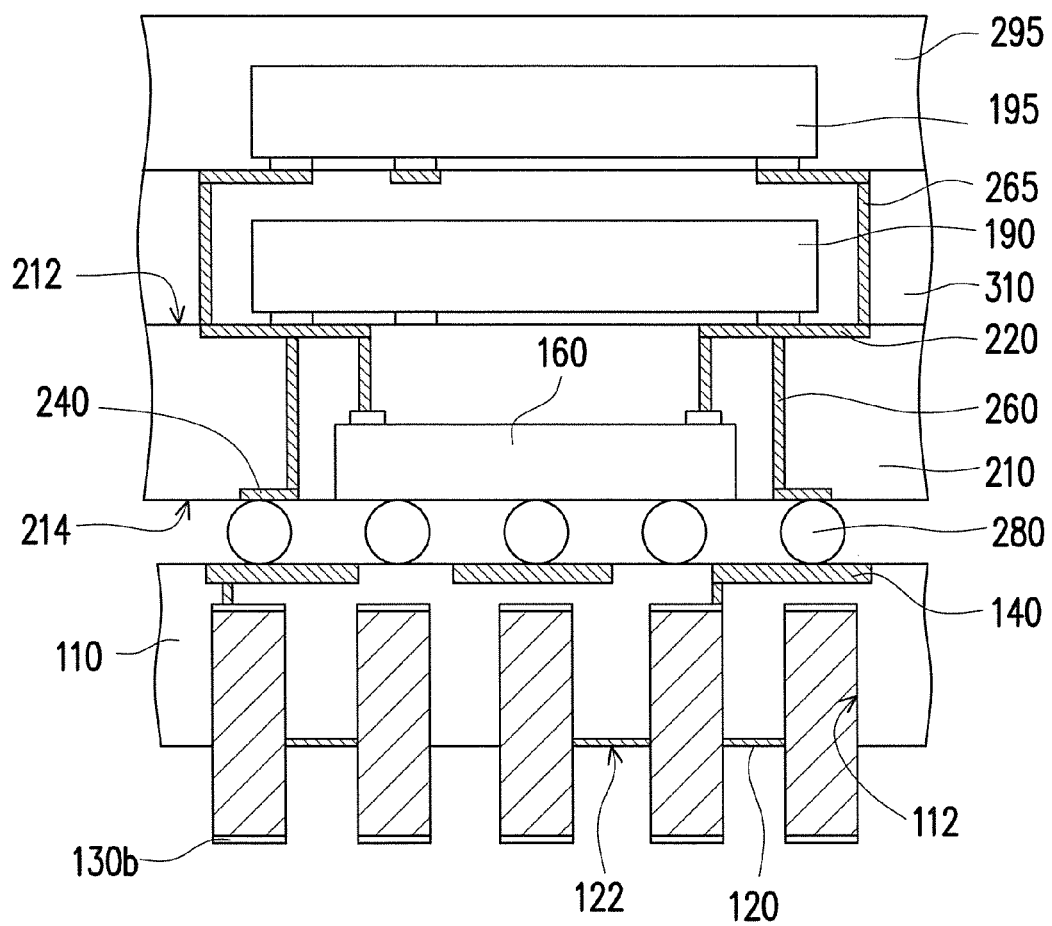

FIG. 21 through FIG. 23 are schematic cross-sectional views of package substrate structures according to various embodiments of the invention. It should be mentioned that package substrate structures illustrated in FIG. 21 through FIG. 23 are respectively similar to the package substrate structures illustrated in FIG. 17, FIG. 19 and FIG. 20, and thus, the element labels and partial content of the previous embodiments are referenced hereinafter, and the same or similar elements are indicated by the same or similar reference labels. The descriptions of the same technical details are therefore not repeated here. The parts omitted from description may be referenced from the afore-described embodiments and are not repeated in the embodiment below.

Figure 19:
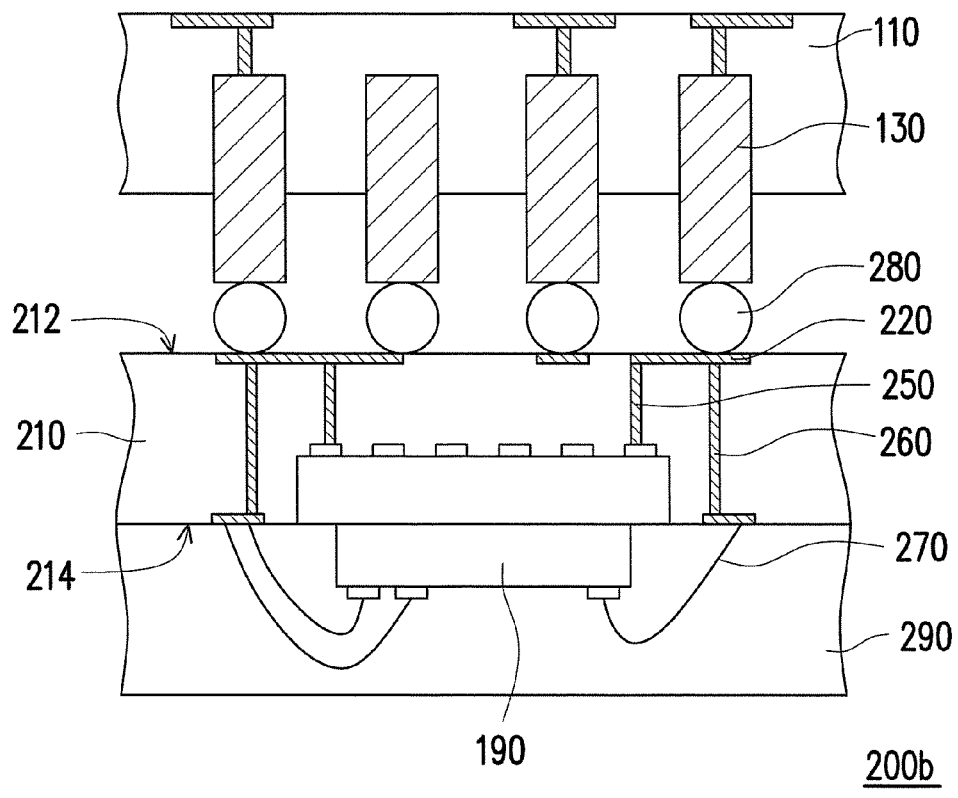

As mentioned above, package substrate structures illustrated in FIG. 21 and FIG. 22 are respectively similar to the package substrate structures illustrated in FIG. 17 and FIG. 19 though in package substrate structures 200d and 200e, the third patterned circuit layer 220 is connected with the second patterned circuit layer 140, such that the first chip 160 may be electrically connected to the second patterned circuit layer 140 through the second conductive vias 250 and the third patterned circuit layer 220. In these embodiments, the package substrate structures 200d and 200e may further include a plurality of solder balls 280 disposed on the third surface 212 and connected between the third patterned circuit layer 220 and the second patterned circuit layer 140. Namely, in the package substrate structures 200d and 200e of these embodiments, the third patterned circuit layer 220 is connected with the second patterned circuit layer 140 through the solder balls 280.

As mentioned above, a package substrate structure 200f illustrated in FIG. 23 is similar to the package substrate structure 200b illustrated in FIG. 19 though in the package substrate structure 200f, the fourth patterned circuit layer 240 is connected with the second patterned circuit layer 140, such that the first chip 160 may be electrically connected to the second patterned circuit layer 140 through the fourth patterned circuit layer 240. In the present embodiment, the package substrate structure 200f may further a plurality of solder balls 280 disposed on the fourth surface 214 and connected between the fourth patterned circuit layer 240 and the second patterned circuit layers 140. Namely, in the package substrate structure 200f of the present embodiment, the fourth patterned circuit layer 240 is connected with the second patterned circuit layers 140 through the solder balls 280. In order to meet the requirement of fine pitch, the first chip 160 is electrically connected to the second patterned circuit layers 140 on the second surface in the embodiments of FIG. 21 through FIG. 23. Thus, the circuit layout may be reconfigured by means of the second patterned circuit layers 140 and the first conductive vias 150, such that a distance between the second patterned circuit layers 140 may be shortened to meet the requirement of fine pitch.

Figure 24:
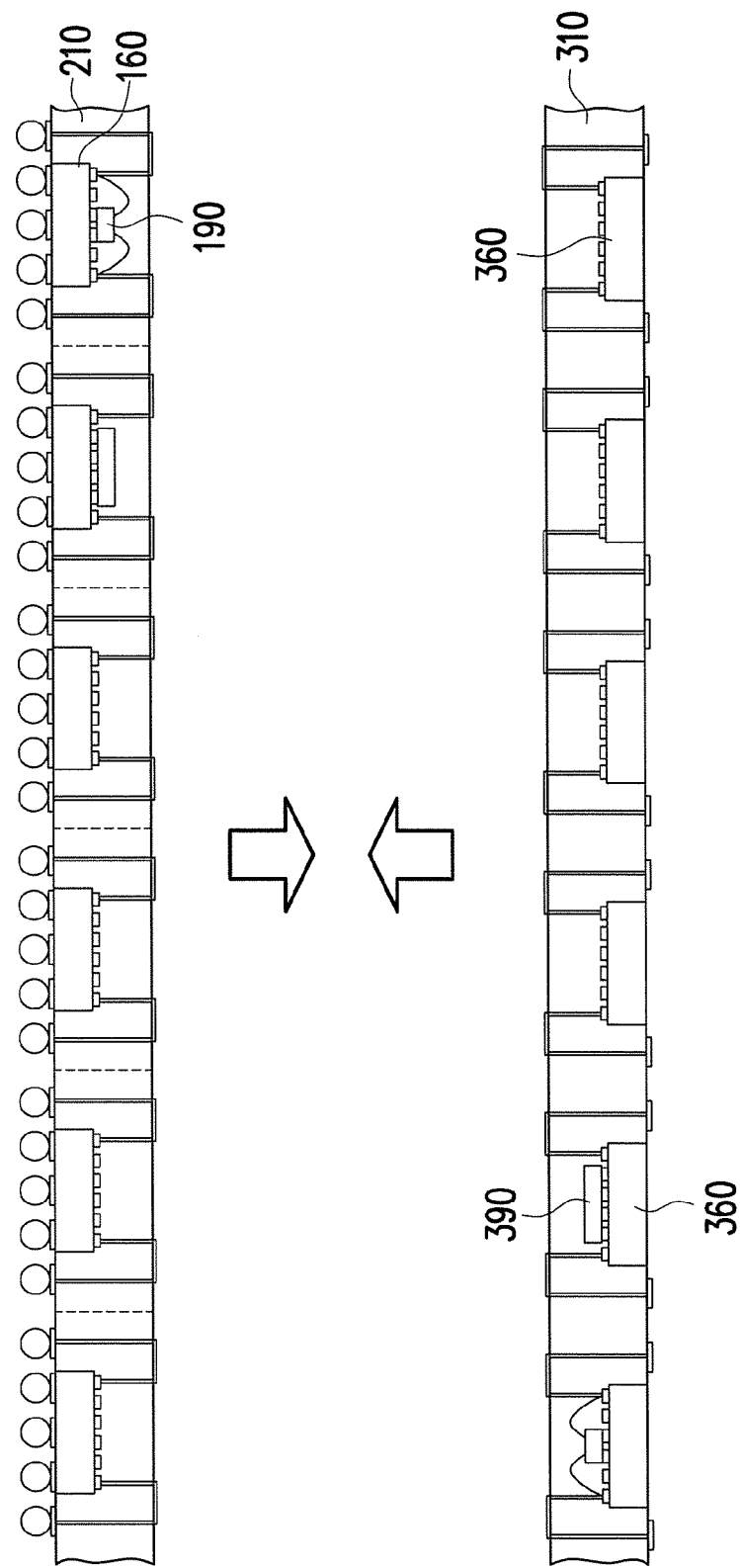
FIG. 24 is a schematic view of a manufacturing process of a package substrate structure according to an embodiment of the invention.

FIG. 24 is a schematic view of a manufacturing process of a package substrate structure according to an embodiment of the invention. In an embodiment of the invention, referring to FIG. 24, a plurality of chips 190, 160, 360 and 390 may be molded by using two selective-electroplating epoxy compounds 210 and 310, the selective-electroplating epoxy compounds 210 and 310 may be directly electroplated to form conductive vias and a redistribution layer by utilizing the selectively electroplating characteristic of the selective-electroplating epoxy compounds 210 and 310 to electrically connect each of the chips 190, 160, 360 and 390 to surfaces of the selective-electroplating epoxy compounds 210 and 310, and the selective-electroplating epoxy compounds 210 and 310 are compressed with each other to electrically conduct on the chips 190, 160, 360 and 390. Then, the selective-electroplating epoxy compounds 210 and 310 are cut along the dotted lines to form a plurality of independent package substrate structures.

Figure 25:
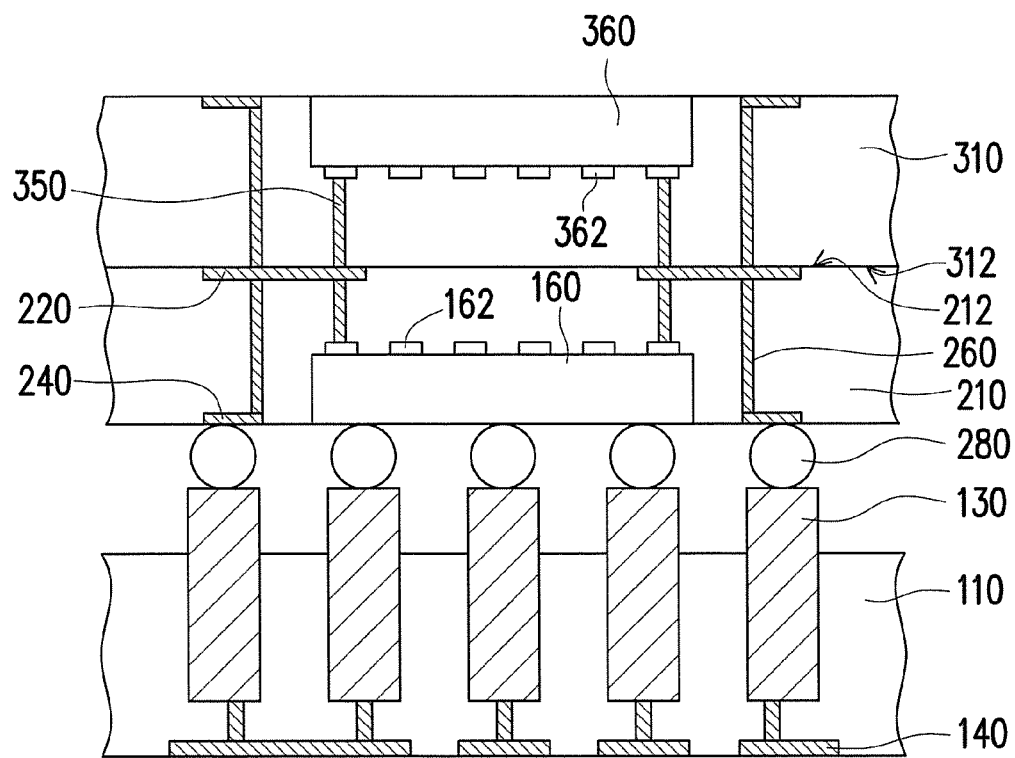
FIG. 25 through FIG. 26 are schematic cross-sectional views of package substrate structures according to various embodiments of the invention.
Figure 26:
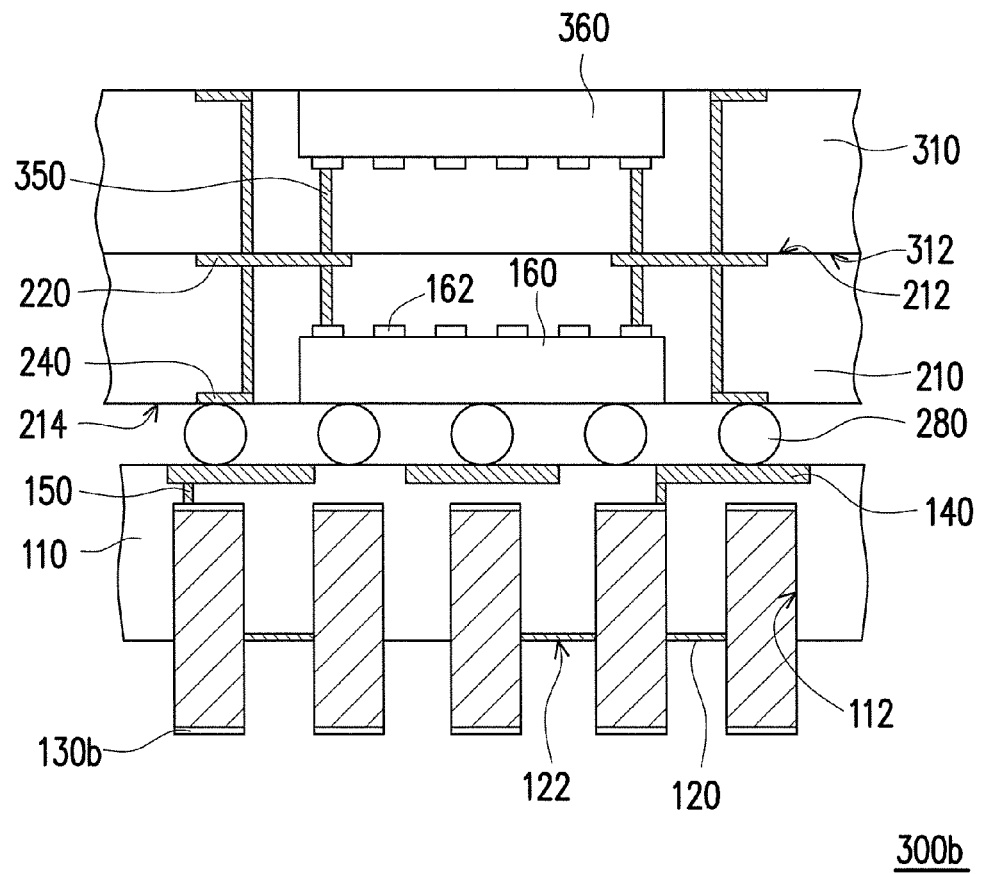

FIG. 25 through FIG. 26 are schematic cross-sectional views of package substrate structures according to various embodiments of the invention. It should be mentioned that FIG. 25 through FIG. 26 illustrate package substrate structures that can be formed by applying the manufacturing method of FIG. 24. First, referring to FIG. 25, a package substrate structure 300a of the present embodiment further includes a first chip 160 and a second chip 360, a second selective-electroplating epoxy compound 210, a third selective-electroplating epoxy compound 310 and a plurality of fourth conductive vias 350. The first chip 160 includes a plurality of first pads 162, and the second selective-electroplating epoxy compound 210 covers the first chip 160. The second chip 360 includes a plurality of second pads 362. The third selective-electroplating epoxy compound 310 covers the second chip 360 and includes a fifth surface 312 connected with the third surface 212 of the second selective-electroplating epoxy compound 210. The fourth conductive vias 350 is directly disposed on the third selective-electroplating epoxy compound 310 to connect the pads 362 to the fifth surface 312 and electrically connected to the third patterned circuit layer 220 located on the third surface 212. Thereby, the second chip 360 is electrically connected to the third patterned circuit layer 220 through the fourth conductive vias 350 and further electrically connected to the solder balls 280 through the third conductive vias 260. In this way, the first chip 160 and the second chip 360 may be electrically connected to the metal studs 130 through the solder balls 280.

A package substrate structure 300b of FIG. 26 is similar to the package substrate structure 300a of FIG. 25, and thus, the element labels and partial content of the previous embodiments are referenced hereinafter, and the same or similar elements are indicated by the same or similar reference labels. The descriptions of the same technical details are therefore not repeated here. The parts omitted from description may be referenced from the afore-described embodiments and are not repeated in the embodiment below.

As mentioned above, the package substrate structure 300b of FIG. 26 is similar to the package substrate structure 300a of FIG. 25 though the fourth patterned circuit layer 240 of the package substrate structure 300 is connected with the second patterned circuit layer 140, such that the first chip 160 may be electrically connected to the second patterned circuit layer 140 through the fourth patterned circuit layer 240. In the present embodiment, the package substrate structure 300b may include a plurality of solder balls 280 disposed on the fourth surface 214 and connected between the fourth patterned circuit layer 240 and the second patterned circuit layer 140. Namely, in the package substrate structure 300b of the present embodiment, the fourth patterned circuit layer 240 is connected with the second patterned circuit layer 140 through the solder balls 280. In order to meet the requirement of fine pitch, the first chip 160 is electrically connected to the second patterned circuit layer 140 on the second surface 116 in the embodiment illustrated in FIG. 26. Thereby, the circuit layout may be reconfigured by means of the second patterned circuit layer 140 and the first conductive vias 150, such that a pitch between the second patterned circuit layers 140 can be shortened to meet the requirement of fine pitch.

Figure 27:
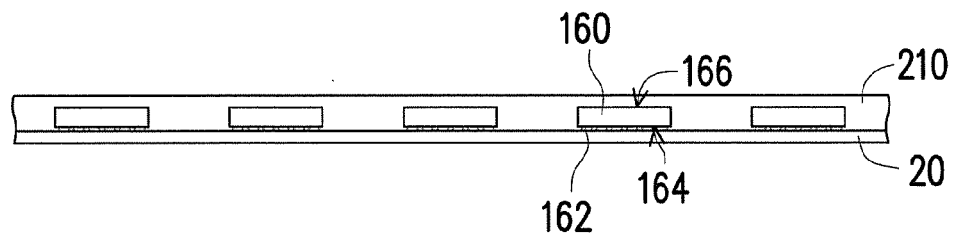
FIG. 27 is a schematic view of a manufacturing process of a package substrate structure according to an embodiment of the invention.

FIG. 27 is a schematic view of a manufacturing process of a package substrate structure according to an embodiment of the invention. In an embodiment of the invention, a plurality of first chips 160 may be disposed on the release film 20, as shown in FIG. 27. Each of the first chips 160 includes a plurality of first pads 162, an active surface 164 and a back surface 166 opposite to the active surface 164. The first pads 162 are disposed on the active surface 164, and the first chips 160 are adhered to the release film 20 with the active surfaces 164. Then, the first chips 160 are encapsulated by the second selective-electroplating epoxy compound 210, and the release film 20 is removed, such that the back surfaces 166 of the first chips 160 are covered by the second selective-electroplating epoxy compound 210 to expose the first pads 162 and the active surfaces 164. Then, the second selective-electroplating epoxy compound 210 is cut along the dotted lines to form a plurality of independent package substrate structures.

FIG. 28 through FIG. 31 are schematic cross-sectional views of package substrate structures according to various embodiments of the invention. It should be mentioned that FIG. 28 through FIG. 31 illustrate various types of package substrate structures by applying the manufacturing method of FIG. 2. First, referring to FIG. 28, a package substrate structure 400a of the present embodiment further includes a dielectric layer 410 and a first redistribution layer 420. The dielectric layer 410 is disposed on the third surface 212 of the second selective-electroplating epoxy compound 210 and covers the first pads 162. The first redistribution layer 420 is disposed on the dielectric layer 410 and electrically connected first pads 162 to an outer surface 412 of the dielectric layer 410. The solder balls 280 are disposed on the outer surface 412 and electrically connect the first redistribution layer 420 to the metal studs 130.

Figure 29:
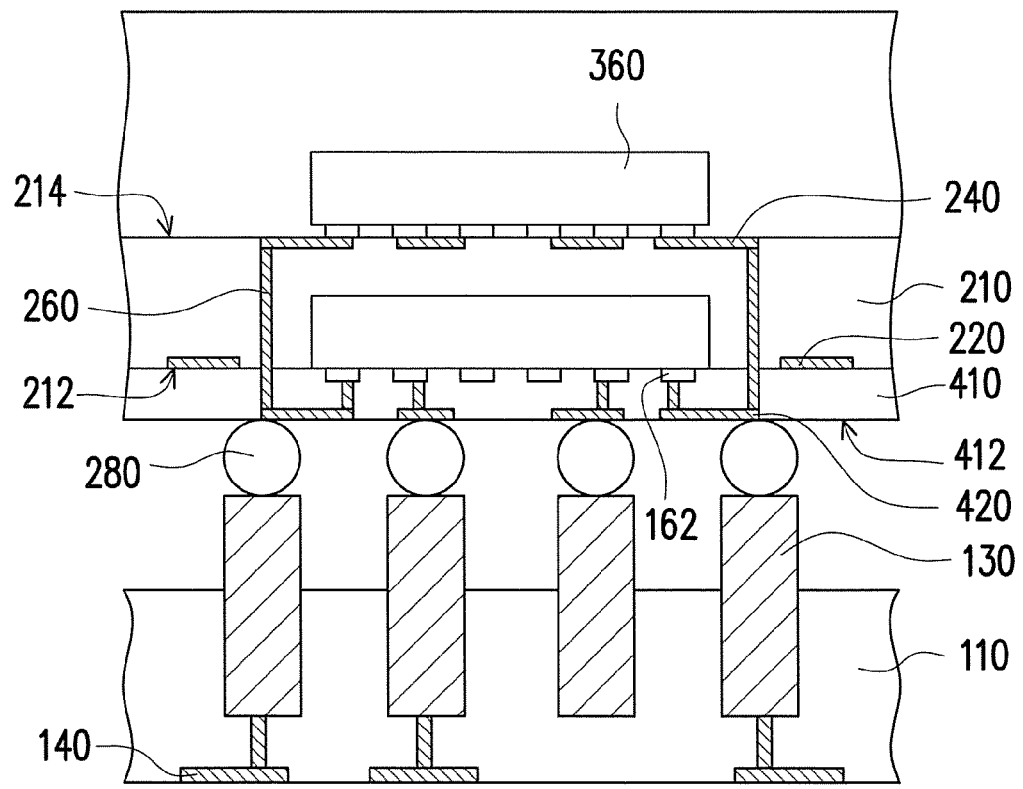

Similar to the former embodiment, a package substrate structure 400b may further include a fourth patterned circuit layer 240, a second chip 360 and a plurality of third conductive vias 260, as shown in FIG. 29. The fourth patterned circuit layer 240 is disposed on the fourth surface 214 of the second selective-electroplating epoxy compound 210, where the fourth surface 214 is opposite to the third surface 212. The second chip 360 is disposed above the fourth surface 214 and electrically connected to the fourth patterned circuit layer 240. The third conductive vias 260 penetrate the second selective-electroplating epoxy compound 210 to connect the first redistribution layer 420 and the fourth patterned circuit layer 240. Thereby, the first chip 160 and the second chip 360 may be electrically connected to the metal studs 130 through a current conducting path formed by the fourth patterned circuit layer 240, the third conductive vias 260, the first redistribution layer 420 and the solder balls 280.

Figure 30:
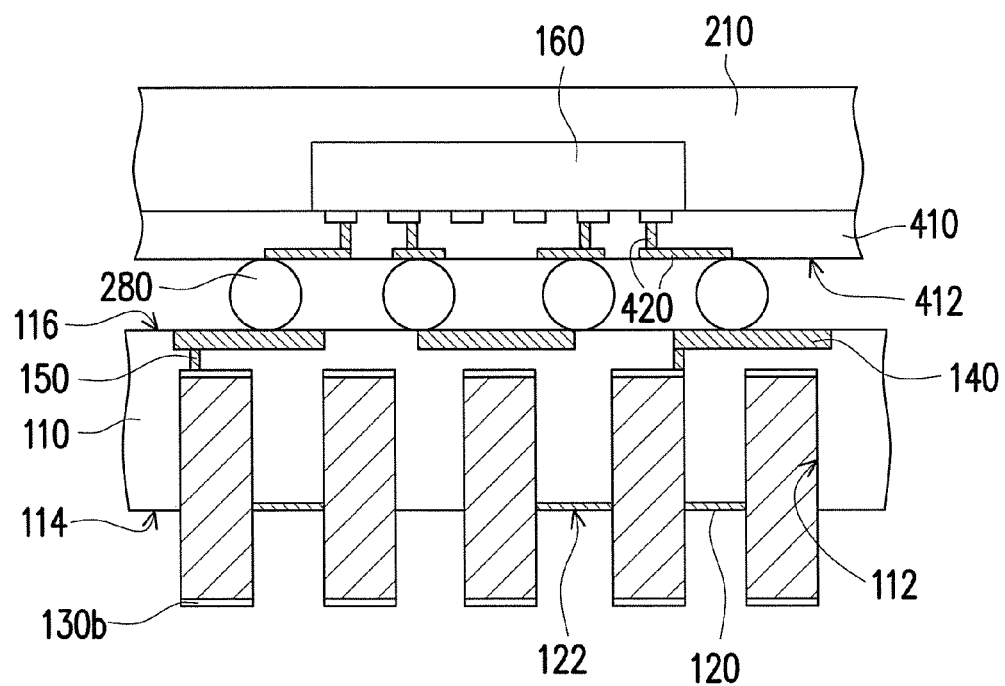
Figure 31:
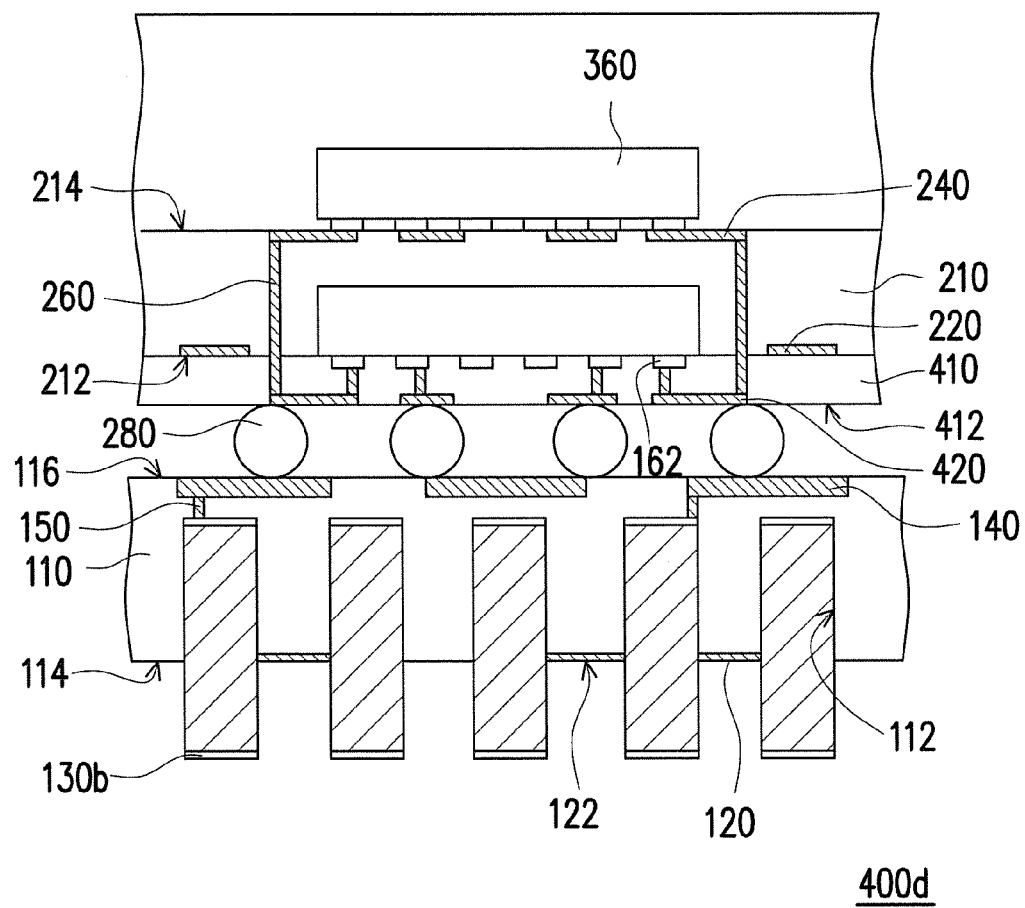

Package substrate structures 400c and 400d of FIG. 30 and FIG. 31 are respectively similar to the package substrate structures 400a and 400b of FIG. 28 and FIG. 29, and thus, the element labels and partial content of the previous embodiments are referenced hereinafter, and the same or similar elements are indicated by the same or similar reference labels. The descriptions of the same technical details are therefore not repeated here. The parts omitted from description may be referenced from the afore-described embodiments and are not repeated in the embodiment below.

Figure 28:
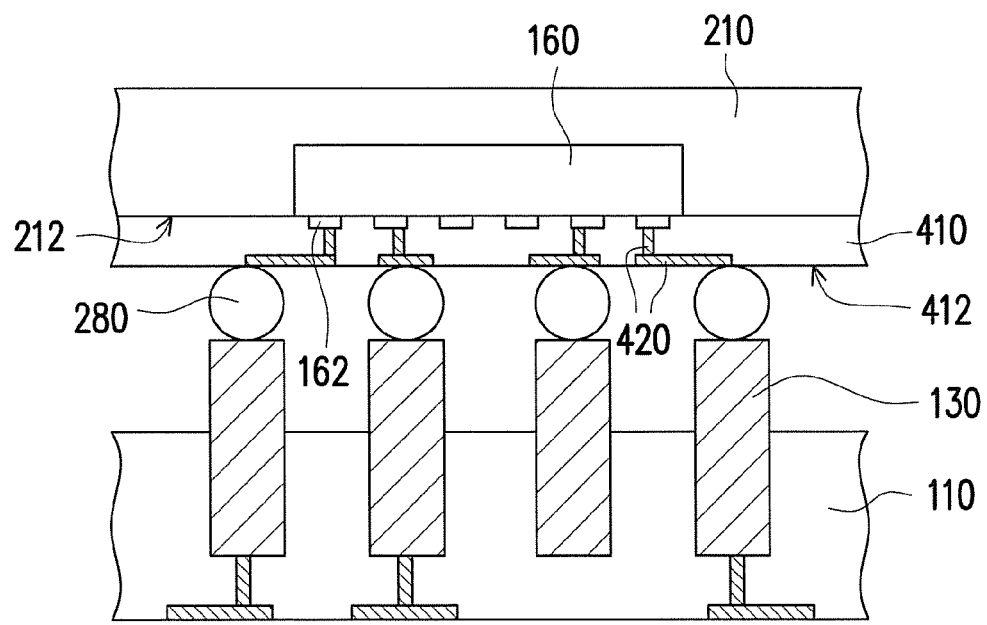
FIG. 28 through FIG. 31 are schematic cross-sectional views of package substrate structures according to various embodiments of the invention.

As mentioned above, package substrate structures 400c and 400d of FIG. 30 and FIG. 31 are respectively similar to the package substrate structures 400a and 400b of FIG. 28 and FIG. 29 though the first redistribution layer 420 of the package substrate structure 400c is connected with the second patterned circuit layer 140, such that first chip 160 may be electrically connected to the second patterned circuit layer 140 through the first redistribution layer 420. In the present embodiment, the solder balls 280 of the package substrate structure 400c are disposed between the second surface 116 and the outer surface 412 of the dielectric layer 410 and connected between the first redistribution layer 420 and the second patterned circuit layer 140. Thereby, in the embodiments illustrated in FIG. 30 and FIG. 31, the first chip 160 is electrically connected to the second patterned circuit layer 140 on the second surface 116. Thus, the circuit layout may be reconfigured by means of the second patterned circuit layer 140 and the first conductive vias 150, such that a pitch between the second patterned circuit layers 140 may be shortened to meet the requirement of fine pitch.

Figure 32A:
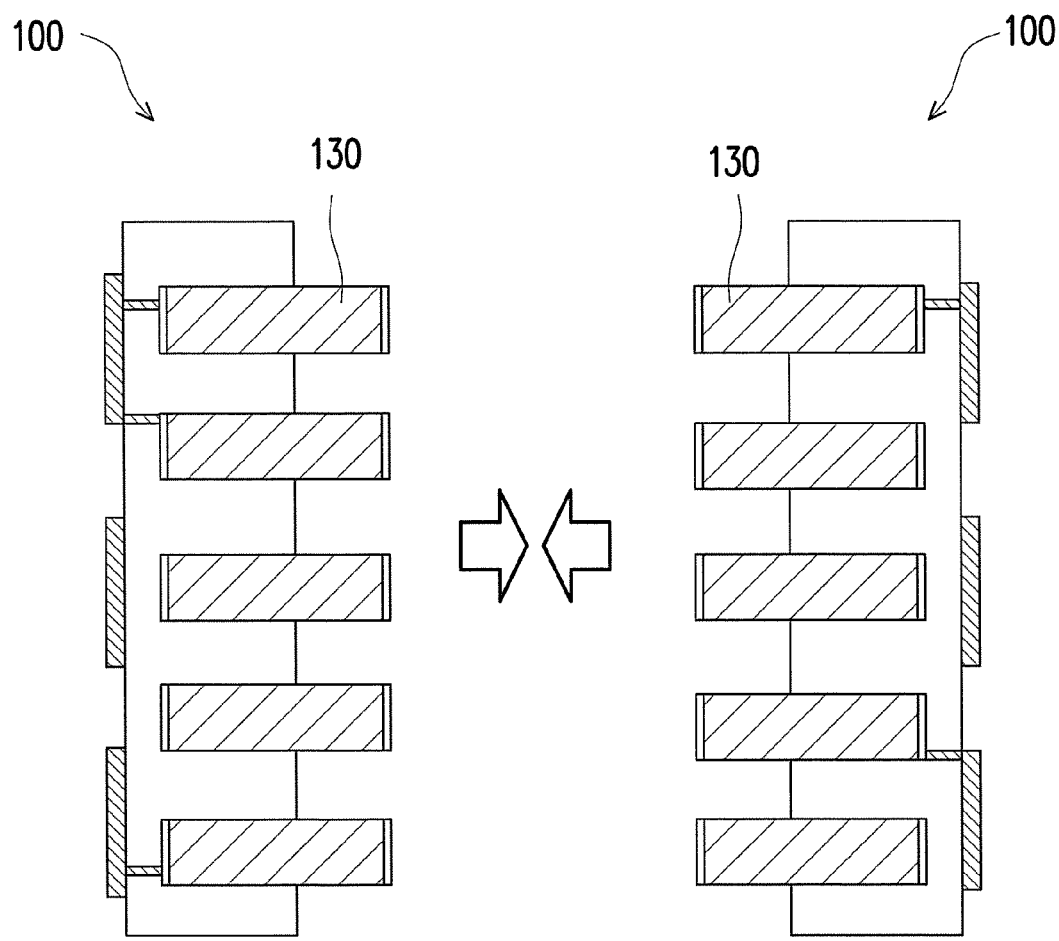
FIG. 32A and FIG. 32B are schematic cross-sectional views of a manufacturing process of a substrate structure according to an embodiment of the invention.
Figure 32B:
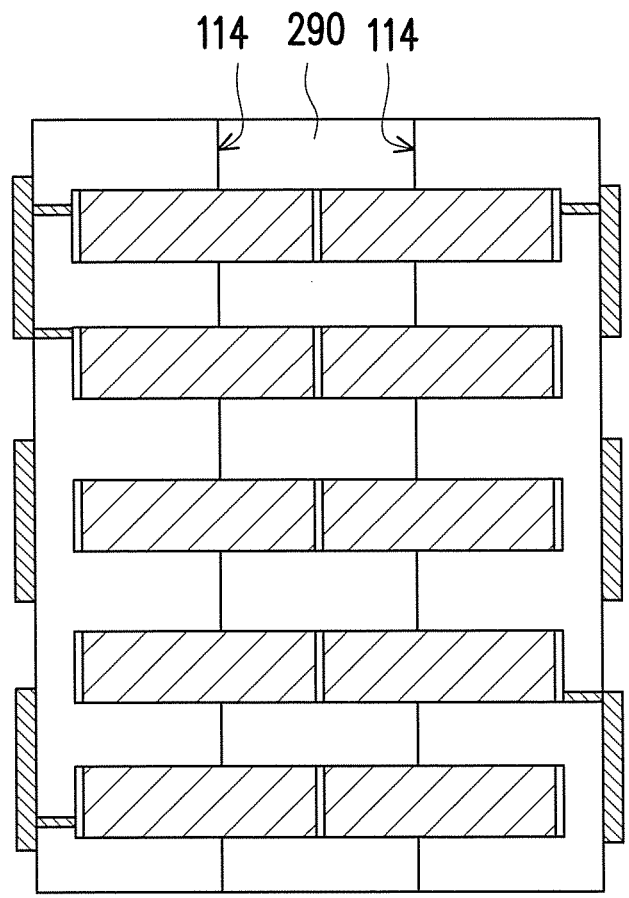

FIG. 32A and FIG. 32B are schematic cross-sectional views of a manufacturing process of a substrate structure according to an embodiment of the invention. In the present embodiment, two package substrate structures 100 illustrated in FIG. 1B may be bonded together to form a substrate structure 10 illustrated in FIG. 32B. In detail, the metal studs 130 of each of the two package substrate structure 100 of FIG. 32A may be bonded with each other by means of thermal bonding, while the first surface 114 of the package substrate structures 100 face to each other. In the present embodiment, a temperature of the thermal bonding process is about 250° C. Meanwhile, after the two package substrate structures 100 are bonded together, the molding compound 290 may be filled between the two package substrate structures 100 to form the substrate structure 10 illustrated in FIG. 32B.

Figure 33:
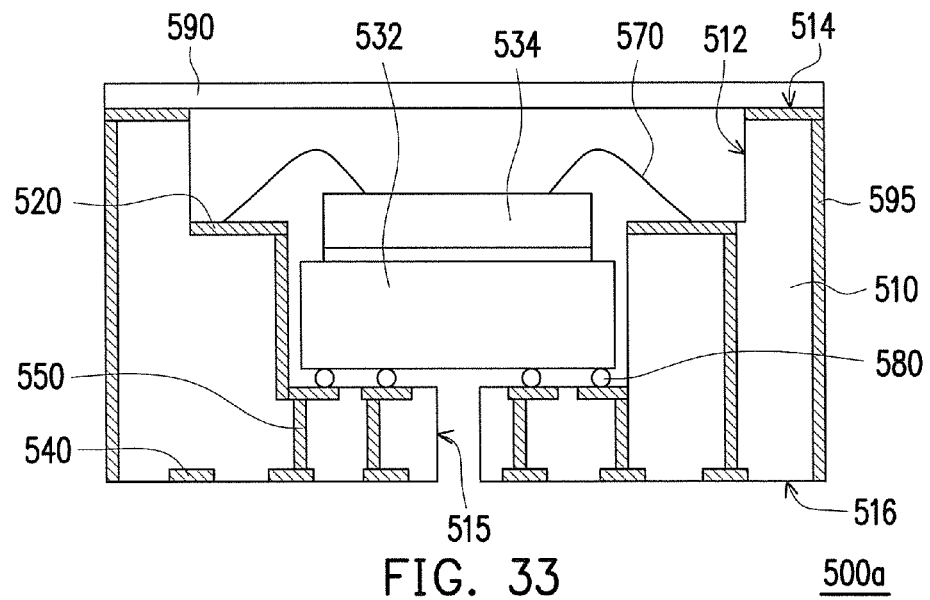
FIG. 33 through FIG. 34 are schematic cross-sectional views of package substrate structures according to various embodiments of the invention.
Figure 34:
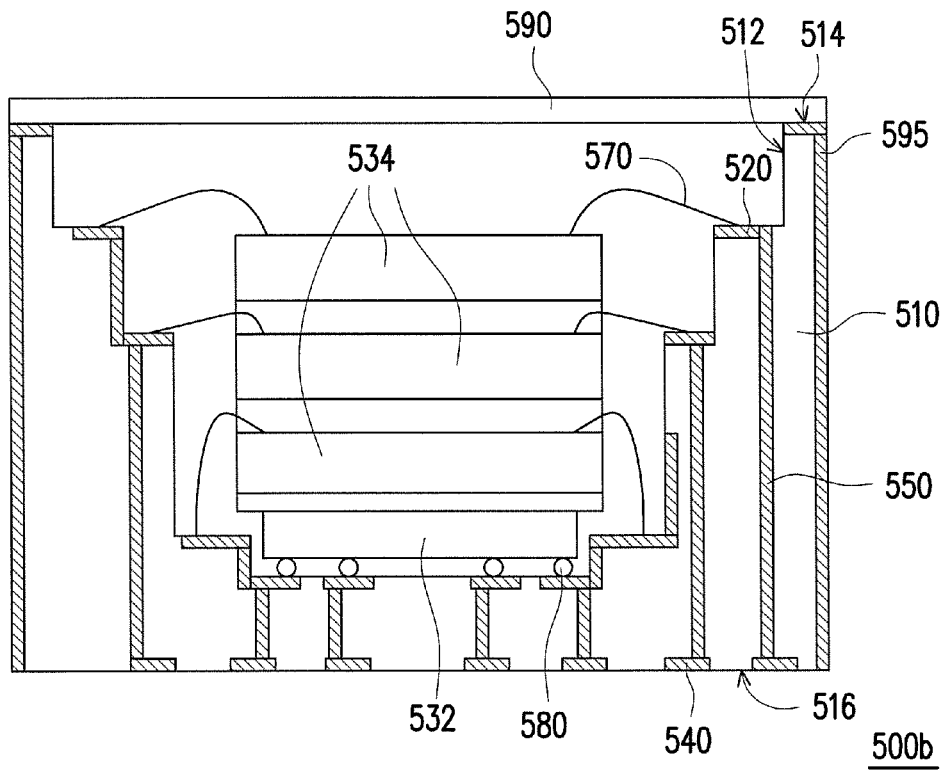

FIG. 33 through FIG. 34 are schematic cross-sectional views of package substrate structures according to various embodiments of the invention. In each of the embodiments, a package substrate structure a selective-electroplating epoxy compound 510, a first patterned circuit layer 520, at least one chip 532, 534, a second patterned circuit layer 540 and a plurality of conductive vias 550. The selective-electroplating epoxy compound 510 includes at least one cavity 512, a first surface 514 and a second surface 516 opposite to the first surface 514. The cavity 512 is disposed on the first surface 514, whose inner wall is a stepped sidewall and includes at least one mesa portion as shown in FIG. 33. The selective-electroplating epoxy compound 510 includes the non-conductive metal complex as it is disclosed in the previous embodiments, such that a circuit trench corresponding to the first patterned circuit layer 520 is carved on an inner wall of the cavity 512 of the selective-electroplating epoxy compound 510 by laser, and then, the first patterned circuit layer 520 is formed by directly electroplating the selective-electroplating epoxy compound 510 on the circuit trench, such that the first patterned circuit layer 520 is directly formed on the inner wall of the cavity 512. In this way, a top surface of the first patterned circuit layer 520 may be lower than or coplanar with the first surface 514, as shown in FIG. 33. Chips 532 and 534 are disposed in the cavity 512 and electrically connected with the patterned circuit layer 520.

In the present embodiment, the chips may include a first chip 532 and at least one second chip 534. The first chip 532 is disposed on a bottom surface of the cavity 512 and electrically connected to the first patterned circuit layer 520 located on a bottom surface of the cavity 512 through a plurality of solder balls 580. In the embodiment illustrated in FIG. 33, the number of the second chip 534 of the package substrate structure 500a may be one, which is stacked above the first chip 532. The second chip 534 is electrically connected to the corresponding first patterned circuit layer 520 located on the mesa portion of the cavity 512 through a plurality of wires 570. Certainly, in other embodiments, a package substrate structure 500b may include a plurality of second chips 534 stacked on the first chip 532, as shown in FIG. 34, and the cavity 512 may include a plurality of mesa portions correspondingly, such that the second chips 534 may be connected to the corresponding mesa portions through the wires 570 to electrically connect the first patterned circuit layer 520 located on the mesa portions. In the same way, the second patterned circuit layer 540 may be formed by directly electroplating the second surface 516 of the selective-electroplating epoxy compound 510 so as to be directly disposed on second surface 516. Thus, the top surface of the second patterned circuit layer 540 may be lower than or coplanar with the second surface 516, as shown in FIG. 34. The conductive vias 550 are disposed in the selective-electroplating epoxy compound 510 to electrically connect the first patterned circuit layer 520 with the second patterned circuit layer 540.

Additionally, referring to FIG. 33, the selective-electroplating epoxy compound 510 of the package substrate structure 500a may further include a through hole 515 penetrating through the selective-electroplating epoxy compound 510 and located in the cavity 512. The through hole 515 exposes a portion of the first chip 532. In this way, when the exposed first chip 532 is employed as a chip for communicating with the external environment, the through hole 515 may serve be employed for sensing the external environment. For example, the first chip 532 may be a temperature, humidity, pressure or audio frequency sensing element, a CMOS image sensing element, or an RF element, and the through hole 515 may be employed as a through hole for sensing the external environment, a vent for ventilation or a sound hole for resonance through hole 515. Thus, the package substrate structure 500a of the invention may meet specific requirement for the special application of the first chip 532.

In the present embodiment, each of the package substrate structures 500a and 500b may further include a package cover 590 disposed on the first surface 514 to cover the cavity 512. The package cover 590 may be package glass, for example. Certainly, in other embodiment, it may also be the molding compound filled in the cavity 512 to cover the chips 532 and 534. In the package substrate structures 500a and 500b of these embodiments, a shielding metal layer 595 may be formed on an outer surface of the selective-electroplating epoxy compound 510 by directly electroplating the selective-electroplating epoxy compound 510. The shielding metal layer 595 covers the outer surface of the selective-electroplating epoxy compound 510 for reducing electric noise coupling and shielding electromagnetic. In these present embodiments, the shielding metal layer 595 may be further connected to grounding electrode to provide a better electromagnetic shielding effect. Meanwhile, the package cover 590 may be metallic package cover and may be electrically connected to the grounding electrode to provide a better electromagnetic shielding effect.

It should be noted herein that these embodiments are merely illustrated as examples, and the invention is not intended to limit the number of the cavity 512. In other embodiments, the selective-electroplating epoxy compound 510 may have a plurality of cavities for respectively containing a plurality of chips, and patterned circuit layers and conductive vias corresponding to each other are formed by directly electroplating the selective-electroplating epoxy compound 510 by utilizing the selectively electroplating characteristic of the selective-electroplating epoxy compound 510 to electrically connect each of the chips and electrically connect each of the chips to the external contact pads. In this way, the chips may be electrically connected with other external electronic devices through the patterned circuit layers and the conductive vias.

Figure 35:
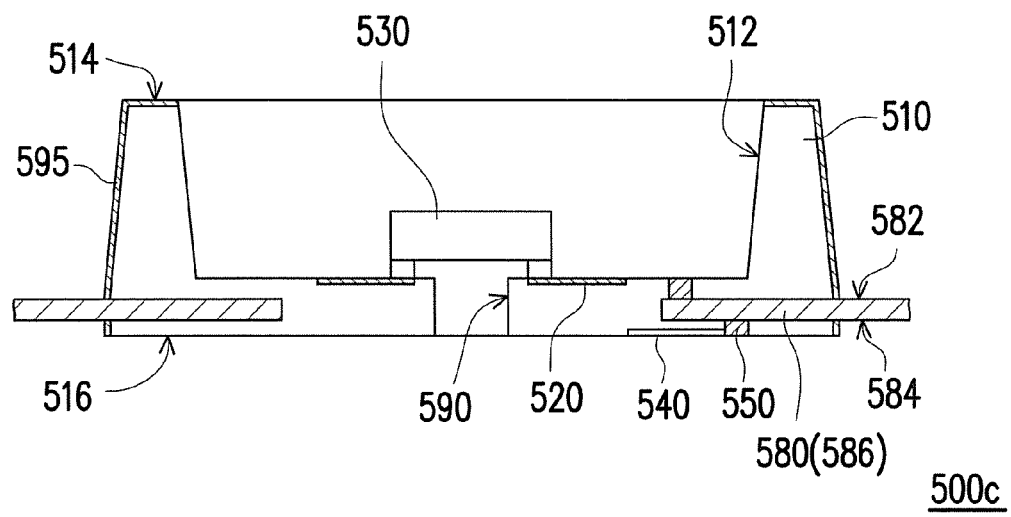
FIG. 35 is a schematic cross-sectional view of a package substrate structure according to an embodiment of the invention.

FIG. 35 is a schematic cross-sectional view of a package substrate structure according to an embodiment of the invention. It should be noted herein that a package substrate structure 500c of the present embodiment is similar to the package substrate structure 500a of FIG. 33, and thus, the element labels and partial content of the previous embodiments are referenced hereinafter, and the same or similar elements are indicated by the same or similar reference labels. The descriptions of the same technical details are therefore not repeated here. The parts omitted from description may be referenced from the afore-described embodiments and are not repeated in the embodiment below. Referring to FIG. 35, difference between the package substrate structure 500c of the present embodiment and the package substrate structure 500a of FIG. 33 will be described below.

The package substrate structure 500c of the present embodiment further includes a lead frame 580 disposed under the cavity 512 and includes a top surface 582, a bottom surface 584 opposite to the top surface 582 and a plurality of leads 586, and the selective-electroplating epoxy compound 510 covers at least a portion of the top surface 582 and a portion of the bottom surface 584. The conductive vias 550 are directly disposed in the selective-electroplating epoxy compound 510 and electrically connected with leads 586, the first patterned circuit layer 520 and the second patterned circuit layer 540. In this way, the chip 530 disposed in the cavity 512 may be electrically connected to the leads 586 through the conductive vias 550. In the present embodiment, the selective-electroplating epoxy compound 510 includes the non-conductive metal complex as it is disclosed in the previous embodiments, such that circuit trenches corresponding to first patterned circuit layer 520, the conductive vias 550 and the second patterned circuit layer 540 are carved on the surface of the selective-electroplating epoxy compound 510 by using laser, and then, the patterned circuit layers 520 and 540 and the conductive vias 550 are formed by directly electroplating the selective-electroplating epoxy compound 510 in the circuit trenches. Thus, the patterned circuit layers 520 and 540 formed in this way are embedded in the selective-electroplating epoxy compound 510, such that top surfaces of the patterned circuit layers 520 and 540 are lower than or at least coplanar with the surface of the selective-electroplating epoxy compound 510.

Additionally, in the present embodiment, the selective-electroplating epoxy compound 510 may further include a through hole 590 located in the cavity 512 and penetrating a bottom portion of the selective-electroplating epoxy compound 510. The leads 586 are disposed around the through hole 590. The through hole 590 exposes an active surface of the chip 530, and a sensing module may be formed by the through hole 590 together with a signal processing chip. The signal processing chip and the sensing chip may be disposed in parallel or in a stack and connected to the first patterned circuit layer 520 through wires. Thereby, when the chip 530 needs to communicate with the external environment, the through hole 590 may be employed for sensing the external environment. For example, the chip 530 may be a temperature, humidity, pressure or audio frequency sensing element, a CMOS image sensing element, or an RF element, and the through hole 515 may be employed as a through hole for sensing the external environment, a vent for ventilation or a sound hole for resonance through hole 515. Thus, the package substrate structure 500c of the invention may meet specific requirement for the special application of the chip 530.

Figure 36:
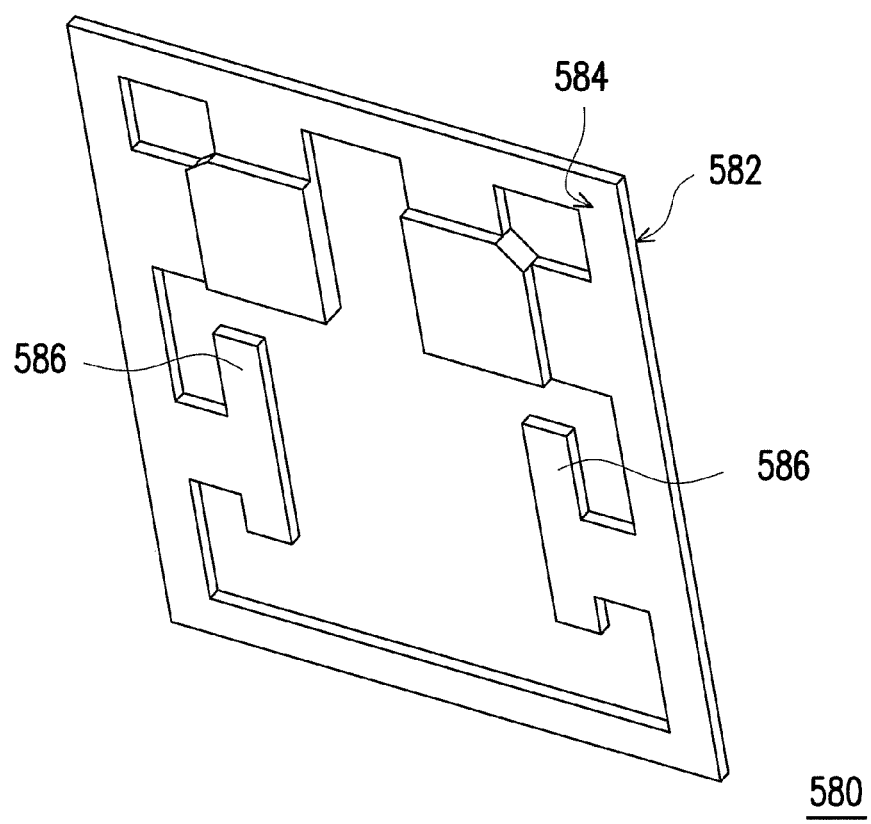
FIG. 36 is a schematic view of the lead frame illustrated in FIG. 35.
Figure 37:
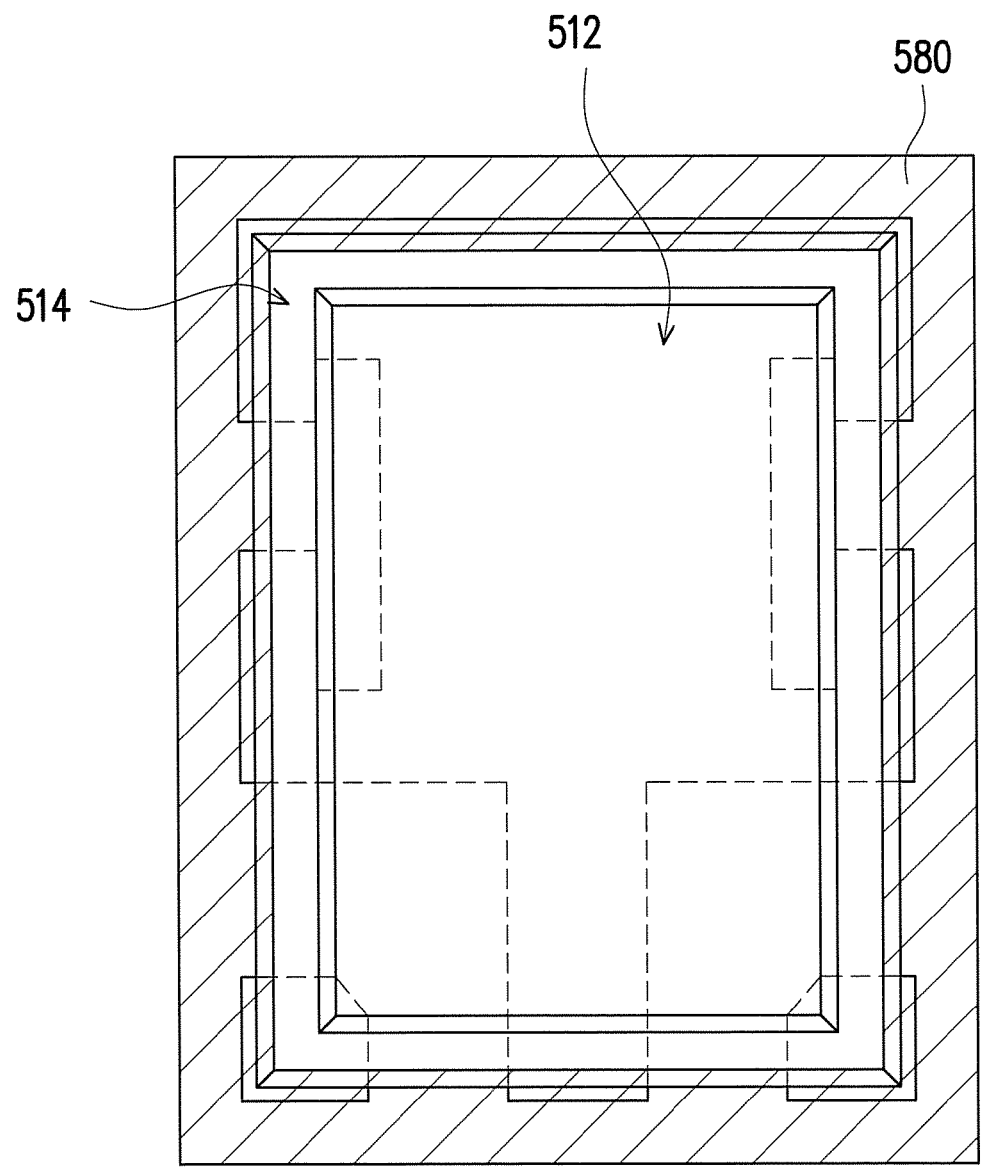
FIG. 37 and FIG. 38 is a schematic of a manufacturing process of the package substrate structure illustrated in FIG. 35.
Figure 38:
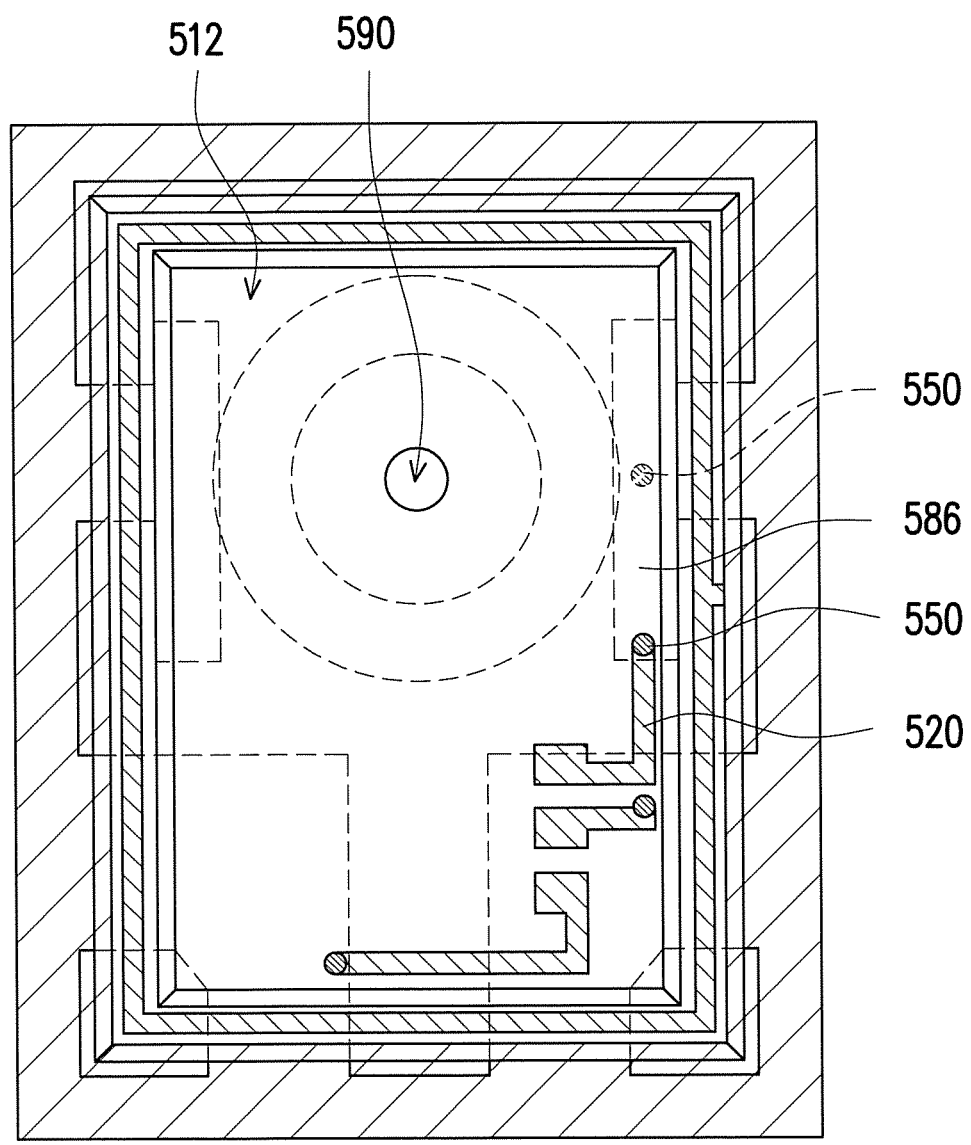

FIG. 36 is a schematic view of the lead frame illustrated in FIG. 35. FIG. 37 and FIG. 38 is a schematic of a manufacturing process of the package substrate structure illustrated in FIG. 35. Referring to FIG. 36 through FIG. 38, a manufacturing method of the package substrate structure 500c may include the following steps. First, a lead frame 580 is provided. Referring to FIG. 36, the lead frame 580 includes a top surface 582, a bottom surface 584 opposite to the top surface 582 and a plurality of leads 586. Then, referring to FIG. 37, selective-electroplating epoxy compound 510 covers a top and a bottom surfaces 582 and 584 of the lead frame 580, respectively, and the cavity 512 is formed on the selective-electroplating epoxy compound 510 by means of molding. The lead frame 580 covered by the selective-electroplating epoxy compound 510 is illustrated by using dotted lines. Thereafter, referring to FIG. 35 and FIG. 38, by directly electroplating the first surface 514 and the second surface 516 of the selective-electroplating epoxy compound 510, the patterned circuit layer 520 and the plurality of conductive vias 550 are formed to electrically connect the patterned circuit layer 520 to the leads 586. Additionally, in the present embodiment, the through hole 590 may be further formed by means of laser drilling. The through hole 590 is located in the cavity 512 and penetrates through the bottom portion of the selective-electroplating epoxy compound 510. Then, the chip 530 is disposed in the cavity, electrically connected to the leads through the patterned circuit layer 520 and the conductive vias 550, and electrically connected to the second patterned circuit layer 540 located on the second surface 516 of the selective-electroplating epoxy compound 510 through the conductive vias 550. Thus, the package substrate structure 500c illustrated in FIG. 35 is formed.

Moreover, in the package substrate structure 500c of the present embodiment, a shielding metal layer 595 may be formed by directly electroplating an outer surface of the selective-electroplating epoxy compound 510 and covers the outer surface of the selective-electroplating epoxy compound 510 for reducing electric noise coupling and shielding electromagnetic. In the present embodiment, shielding metal layer 595 may be further connected to grounding electrode to provide a better electromagnetic shielding effect.

In light of the foregoing, the invention utilizes the selectively electroplating characteristic of the selective-electroplating epoxy compound to form conductive structures, such as the patterned circuit layers, the conductive vias or the contact pads by directly electroplating the surface of the selective-electroplating epoxy compound. The selective-electroplating epoxy compound includes the non-conductive metal complex, such that after the selective-electroplating epoxy compound is selectively irradiated by laser or UV light, the conductive structures such as the patterned circuit layers, the conductive vias or the contact pads can be formed by selectively electroplating the surface of the selective-electroplating epoxy compound directly. Therefore, the selective-electroplating epoxy compound can be adapted to various types of package substrate structures to form circuit layers on the selective-electroplating epoxy compound by utilizing the selective-electroplating characteristic.

Moreover, the patterned circuit layers formed in this way can not only meet the standard of fine pitch but also offer flexibility in designing the connection circuits on the package substrate structure. Meanwhile, the selective-electroplating epoxy compound is patterned by means of molding and thus, has better flexibility in designing the thickness and the shape thereof, which contributes to limiting the thickness of the selective-electroplating epoxy compound under 100µ. Accordingly, the package substrate structure of the invention can not only meet the standard of fine pitch, but also be manufactured by simplified manufacturing process and have smaller overall thickness.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A package substrate structure, comprising:
    a first selective-electroplating epoxy compound, comprising a plurality of cavities, a first surface and a second surface opposite to the first surface, wherein the cavities are disposed on the first surface, and the first selective-electroplating epoxy compound comprises non-conductive metal complex;
    a first patterned circuit layer, directly disposed on the first surface, wherein the first selective-electroplating epoxy compound exposes a top surface of the first patterned circuit layer, and the top surface of the first patterned circuit layer is lower than the first surface or coplanar with first surface;
    a plurality of metal studs, respectively disposed in the cavities and protruding from the first surface, wherein the first patterned circuit layer is electrically connected with the corresponding metal studs;
    a plurality of second patterned circuit layers, directly disposed on the second surface, wherein the first selective-electroplating epoxy compound exposes a top surface of each of the second patterned circuit layers, and the top surface of each of the second patterned circuit layers is lower than the second surface or coplanar with the second surface; and
    a plurality of first conductive vias, disposed in the first selective-electroplating epoxy compound to electrically connect the second patterned circuit layers to the corresponding metal studs.

2. The package substrate structure as claimed in claim 1, wherein the non-conductive metal complex comprises palladium (Pd), chromium, or copper complex.

3. The package substrate structure as claimed in claim 1, wherein the first selective-electroplating epoxy compound is adapted to be selectively irradiated by laser or ultraviolet (UV) light to selectively metallize the non-conductive metal complex.

4. The package substrate structure as claimed in claim 1, further comprising:
    at least one first chip, electrically connected with the metal studs.

5. The package substrate structure as claimed in claim 4, wherein the first chip directly disposed on the metal studs.

6. The package substrate structure as claimed in claim 5, further comprising a plurality of wires, a plurality of solder balls and at least one second chip, wherein the at least one second chip is stacked on the first chip, the solder balls are disposed between the first chip and a part of the metal studs, the wires connect the second chip to another part of the metal studs.

7. The package substrate structure as claimed in claim 5, wherein the first selective-electroplating epoxy compound further comprises a through hole penetrating through the first selective-electroplating epoxy compound and located between the metal studs, the first chip is disposed on the metal studs, and the through hole exposes an active surface of the first chip.

8. The package substrate structure as claimed in claim 4, wherein the first chip is directly disposed on the second patterned circuit layers and electrically connected to the metal studs through the corresponding first conductive vias.

9. The package substrate structure as claimed in claim 8, further comprising a plurality of wires and at least one second chip, wherein the second chip is stacked on the first chip, and the first chip and the second chip are electrically connected to the second patterned circuit layers through the wires.

10. The package substrate structure as claimed in claim 8, further comprising a plurality of wires, a plurality of solder balls and at least one second chip, wherein the second chip is stacked on the first chip, the solder balls are disposed between the first chip and a portion of the second patterned circuit layers, and the wires connect the second chip to the other portion of the second patterned circuit layers.

11. The package substrate structure as claimed in claim 8, wherein the first selective-electroplating epoxy compound further comprises a through hole penetrating through the first selective-electroplating epoxy compound and located between the second patterned circuit layers, the first chip is disposed on the second patterned circuit layers, and the through hole exposes an active surface of the first chip.

12. The package substrate structure as claimed in claim 8, further comprising an underfill filled between the first chip and the second patterned circuit layers.

13. The package substrate structure as claimed in claim 4, wherein the first chip comprises a plurality of first pads, an active surface and a back surface opposite to the active surface, wherein the first pads are disposed on the active surface, and the package substrate structure further comprises:
    a second selective-electroplating epoxy compound, comprising a third surface and a fourth surface which are opposite to each other and covering the active surface and the first pads of the first chip;
    a plurality of second conductive vias, directly disposed at the second selective-electroplating epoxy compound to connect the first pads to the third surface; and
    a third patterned circuit layer, directly disposed on third surface and electrically connected with the second conductive vias, wherein a top surface of the third patterned circuit layer is lower than the third surface or coplanar with the third surface.

14. The package substrate structure as claimed in claim 13, further comprising:
    a plurality of solder balls, disposed on the third surface and connected between the third patterned circuit layer and the metal studs to electrically connect the first chip to the metal studs through the solder balls.

15. The package substrate structure as claimed in claim 13, further comprising:
    a plurality of solder balls, disposed on the third surface and connected between the third patterned circuit layer and the second patterned circuit layers to electrically connect the first chip to the second patterned circuit layers through the solder balls.

16. The package substrate structure as claimed in claim 13, further comprising:
a second chip, disposed on the third surface and electrically connected with the third patterned circuit layer.

17. The package substrate structure as claimed in claim 13, further comprising:
a plurality of third conductive vias, penetrating through the second selective-electroplating epoxy compound to connect the fourth surface to the corresponding solder balls located on the third surface;
a second chip, disposed on the fourth surface and electrically connected with the third conductive vias; and
a third selective-electroplating epoxy compound, covering the second chip.

18. The package substrate structure as claimed in claim 17, further comprising:
a plurality of fourth conductive vias, penetrating the third selective-electroplating epoxy compound to connect a top surface and a bottom surface of the third selective-electroplating epoxy compound with each other;
a third chip, disposed on the third selective-electroplating epoxy compound and electrically connected with the fourth conductive vias; and
a molding compound, covering the third chip.

19. The package substrate structure as claimed in claim 18, further comprising:
a fourth patterned circuit layer, directly disposed on the fourth surface, wherein a top surface of the fourth patterned circuit layer is lower than the fourth surface or coplanar with the fourth surface;
a plurality of third conductive vias, penetrating through the second selective-electroplating epoxy compound to connect the third patterned circuit layer with the fourth patterned circuit layer; and
a plurality of solder balls, disposed on the fourth surface and connected between the fourth patterned circuit layer and the metal studs.

20. The package substrate structure as claimed in claim 18, further comprising:
a fourth patterned circuit layer, directly disposed on the fourth surface, wherein a top surface of the fourth patterned circuit layer is lower than the fourth surface or coplanar with the fourth surface;
a plurality of third conductive vias, penetrating through the second selective-electroplating epoxy compound to connect the third patterned circuit layer with the fourth patterned circuit layer; and
a plurality of solder balls, disposed on the fourth surface and connected between the fourth patterned circuit layer and the second patterned circuit layer.

21. The package substrate structure as claimed in claim 1, further comprising:
a first chip, comprising a plurality of first pads, an active surface and a back surface opposite to the active surface, wherein the first pads are disposed on the active surface;
a second selective-electroplating epoxy compound, covering the back surface of the first chip and exposing the first pads;
a dielectric layer, disposed on a third surface of the second selective-electroplating epoxy compound, covering the first pads and having an outer surface connected with the metal studs; and a first redistribution layer, disposed on the dielectric layer to electrically connect the first pads to the metal studs.

22. The package substrate structure as claimed in claim 21, further comprising:
a plurality of solder balls, disposed on the outer surface of the dielectric layer and electrically connecting the first redistribution layer to the metal studs.

23. The package substrate structure as claimed in claim 21, further comprising:
a plurality of solder balls, disposed on the outer surface of the dielectric layer and electrically connecting the first redistribution layer to the second patterned circuit layer.

24. The package substrate structure as claimed in claim 21, further comprising:
a fourth patterned circuit layer, disposed on a fourth surface of the second selective-electroplating epoxy compound, and the fourth surface is opposite to the third surface;
a second chip, disposed on the fourth surface and electrically connected with the fourth patterned circuit layer; and
a plurality of third conductive vias, penetrating through the second selective-electroplating epoxy compound to connect the fourth patterned circuit layer with the first redistribution layer.

25. A package structure, comprising two package substrate structures as claimed in claim 1, wherein the package substrate structures are connected with each other through metal studs of each, and the first surfaces of the package substrate structures are opposite to each other.

26. A package substrate structure, comprising:
a selective-electroplating epoxy compound, comprising a first surface, a second surface opposite to the first surface and non-conductive metal complex;
a first patterned circuit layer, directly disposed on the first surface and having a top surface lower than the first surface or coplanar with the first surface;
a second patterned circuit layer, directly disposed on the second surface and having a top surface lower than the second surface or coplanar with the second surface;
a plurality of conductive vias, disposed in the selective-electroplating epoxy compound to electrically connect the first patterned circuit layer with the corresponding second patterned circuit layer.

27. The package substrate structure as claimed in claim 26, wherein the selective-electroplating epoxy compound further comprises at least one cavity disposed on the first surface, and the first patterned circuit layer is directly disposed on an inner wall of the cavity.

28. The package substrate structure as claimed in claim 27, further comprising at least one chip disposed in the cavity and electrically connected with the first patterned circuit layer.

29. The package substrate structure as claimed in claim 27, wherein the inner wall comprises a stepped sidewall comprising at least one mesa portion, the package substrate structure further comprises a first chip and at least one second chip, the first chip is disposed on a bottom surface of the cavity and electrically connected to the first patterned circuit layer located on the bottom surface through a plurality of solder balls, the at least one second chip is stacked on the first chip and electrically connected to the corresponding first patterned circuit layer located on the at least one mesa portion through a plurality of wires.

30. The package substrate structure as claimed in claim 27, further comprising:

a package cover, disposed on the first surface to cover the cavity.

31. The package substrate structure as claimed in claim 30, wherein the package cover is a metallic package cover electrically connected to a grounding electrode.

32. The package substrate structure as claimed in claim 27, further comprising a lead frame disposed under the cavity and comprising a top surface, a bottom surface opposite to the top surface and a plurality of leads, wherein the selective-electroplating epoxy compound covers at least a portion of the top surface and a portion of the bottom surface, and the conductive vias are electrically connected with the leads.

33. The package substrate structure as claimed in claim 32, wherein the selective-electroplating epoxy compound further comprises a through hole located in the cavity and penetrating through a bottom portion of the selective-electroplating epoxy compound, the leads surround the through hole, and the through hole exposes an active surface of the chip.

34. The package substrate structure as claimed in claim 32, further comprising:
a shielding metal layer, covering an outer surface of the package substrate structure and connected to a grounding electrode.

35. The package substrate structure as claimed in claim 26, further comprising:
a shielding metal layer, covering an outer surface of the package substrate structure and connected to a grounding electrode.

* * * * *